US007396735B2

(12) United States Patent
Nakanishi et al.

(10) Patent No.: US 7,396,735 B2
(45) Date of Patent: Jul. 8, 2008

(54) SEMICONDUCTOR ELEMENT HEAT DISSIPATING MEMBER, SEMICONDUCTOR DEVICE USING SAME, AND METHOD FOR MANUFACTURING SAME

(75) Inventors: Kazuyuki Nakanishi, Seto (JP); Tadashi Oshima, Aichi-gun (JP); Hideo Hasegawa, Negoya (JP); Hiroyuki Mori, Nisshin (JP); Hideo Tachikawa, Nisshin (JP); Yukio Miyachi, Owariasahi (JP); Yasushi Yamada, Nishikamo-gun (JP); Hiroyuki Ueda, Kasugai (JP); Masayasu Ishiko, Nagoya (JP)

(73) Assignee: Kabushiki Kaisha Toyota Chuo Kenkyusyo, Aichi-gun (JP)

( * ) Notice: Subject to any disclaimer, the term of this patent is extended or adjusted under 35 U.S.C. 154(b) by 234 days.

(21) Appl. No.: 10/538,222

(22) PCT Filed: Dec. 9, 2003

(86) PCT No.: PCT/JP03/15741

§ 371 (c)(1), (2), (4) Date: Jun. 9, 2005

(87) PCT Pub. No.: WO2004/053984

PCT Pub. Date: Jun. 24, 2004

(65) Prior Publication Data

US 2006/0057768 A1 Mar. 16, 2006

(51) Int. Cl.
*H01L 21/76* (2006.01)

(52) U.S. Cl. ................................ 438/408; 257/E23.006

(58) Field of Classification Search ................. 438/106, 438/619, 637, 654, 694; 430/60–66, 57–58, 430/127–131; 257/10, 130, 64, 687, 758
See application file for complete search history.

(56) References Cited

U.S. PATENT DOCUMENTS 4,783,368 A * 11/1988 Yamamoto et al. .......... 428/408
4,971,667 A 11/1990 Yamazaki et al.
5,056,929 A * 10/1991 Watanabe et al. ........... 374/181

(Continued)

FOREIGN PATENT DOCUMENTS

JP 33463/1986 2/1986

(Continued)

OTHER PUBLICATIONS

K. Jagannadham: "Multilayer Diamond Heat Spreaders for Electronic Power Devices", Solid-State Electronics, vol. 42, No. 12, pp. 2199-2208, 1998.

*Primary Examiner*—Michael S. Lebentritt
*Assistant Examiner*—Andre' Stevenson
(74) *Attorney, Agent, or Firm*—Oblon, Spivak, McClelland, Maier & Neustadt, P.C.

(57) ABSTRACT

A semiconductor element heat dissipating member is provided which has excellent heat dissipation characteristics and adhesion characteristics and enables production of a semiconductor device at a low cost. A semiconductor device using the same, and a method of producing the same are also provided. The semiconductor element heat dissipating member has a conductive substrate and an electrically insulating amorphous carbon film containing hydrogen, and the electrically insulating amorphous carbon film is formed at least on a region of the conductive substrate on which region a semiconductor element is to be mounted.

20 Claims, 13 Drawing Sheets

201

70
71
80
61
62
52
41
60
20
42
51
40
50
10
11

U.S. PATENT DOCUMENTS

| | | | | |
|---|---|---|---|---|
| 5,412,160 | A | 5/1995 | Yasumoto et al. | |
| 5,644,455 | A * | 7/1997 | Schultz | 360/320 |
| 2005/0142361 | A1 * | 6/2005 | Nakanishi et al. | 428/408 |
| 2006/0057768 | A1 * | 3/2006 | Nakanishi et al. | 438/106 |

FOREIGN PATENT DOCUMENTS

| | | |
|---|---|---|
| JP | 62-157602 | 7/1987 |
| JP | 62-180073 | 8/1987 |
| JP | 63-124555 | 5/1988 |
| JP | 7-99268 | 4/1995 |
| JP | 10-32213 | 2/1998 |
| JP | 11-292692 | 10/1999 |
| JP | 2000-174166 | 6/2000 |
| JP | 2001-332798 | 11/2001 |

* cited by examiner

SEMICONDUCTOR ELEMENT HEAT DISSIPATING MEMBER, SEMICONDUCTOR DEVICE USING SAME, AND METHOD FOR MANUFACTURING SAME

TECHNICAL FIELD

The present invention relates to a semiconductor element heat dissipating member for dissipating heat generated in semiconductor elements, a semiconductor device using the same and a production method thereof.

BACKGROUND ART

There is a problem of the increase in heat generation caused by development of a high-power downsized semiconductor element with an electric power control. A conventional semiconductor device forms a module in which a semiconductor element is disposed on a substrate made of an electrical insulator so as to electrically isolate the semiconductor element, and in which the electrically insulating substrate is disposed on a heat sink (a heat dissipating plate) and a cooling plate.

AlN (described, for example in Japanese Patent Application Laid-Open (JP-A) No.7-99268) or $Al_2O_3$ is widely used as a heat sink material which should provide electrical insulation and thermal conductivity.

An example of the structure of the semiconductor device using a ceramic substrate such as AlN disclosed, for example, in JP-A No.7-99268 is a structure in which: conductive layers such as Cu plates are brazed onto both sides of an electrically insulating substrate made of AlN, the Cu plate on one of the sides is plated with Ni; a semiconductor element is provided on the Ni-plated surface; and a dissipating plate is soldered onto the other Cu plate.

In another example, conductive layers made of Al are provided on both sides of an electrically insulating substrate made of AlN; a semiconductor element is provided on the Al conductive layer on one of the sides; a heat dissipating plate made of Cu—Mo or Al—SiC capable of reducing thermal stress is soldered onto the other Al conductive layer; and an Al cooling plate is attached onto the heat dissipating plate by grease.

However, since a conventional semiconductor device using ceramics such as AlN described above has a complicated and multi-layered structure, heat dissipating property is not satisfactory, and the producing cost is high.

It has been proposed (see JP-A Nos. 11-292692 and 2000-174166) to use a gas-phase synthesized diamond (insulating hard crystalline carbon film) substrate or a substrate obtained by coating AlN with a gas-phase synthesized diamond as a heat sink so as to improve the heat dissipating property of the heat sink.

When a diamond with a high thermal conductivity is used as the heat sink, the heat-dissipation property is improved; however, the following problems occur: (1) since the surface of the diamond grown by the gas-phase synthesis method has significant unevenness, the surface needs polishing and it is very difficult to secure a sufficient surface smoothness; (2) peel-off occurs easily, a surface activation treatment has to be conducted in advance in order to allow diamond to grow thereon (the surface activation treatment may be roughening of the surface of the electrically conductive substrate by diamond polishing), and it is impossible to grow diamond on the surfaces of some conductive substrates (for example, it is impossible to form diamond on Al or Cu); (3) productivity is low and producing cost is high because of a slow film-forming rate; and (4) diamond has poor compatibility with other material whereby it is not easy to make an electrode comprising diamond.

On the other hand, another example has been reported (see, JP-A No. 10-32213). In the example, the protective layer of the semiconductor element is an electrically insulating amorphous carbon film, which has inferior thermal conductivity than diamond but which is easier to produce than diamond. Further, JP-A No. 10-223625 discloses an example in which an electrically insulating amorphous carbon film is used as an electrically insulating film of a semiconductor device. Such a hard amorphous carbon film is a diamond-like carbon (DLC) film, which has been spotlighted as a low-friction sliding material superior in anti-adhesion property and friction resistance.

When the semiconductor element is a power device such as an IGBT element and the semiconductor element has an electrically insulating amorphous carbon film as a protective layer, the electrically insulating amorphous carbon film contributes heat dissipation in a horizontal direction of the semiconductor element; however, the contribution is low compared with the heat dissipation in the vertical direction of the semiconductor element, which is the heat dissipation through the heat sink disposed on the surface on the side opposite to the side having the protective layer for the semiconductor element, so that the heat dissipation property as a whole is not sufficient in some cases.

In addition to the problems described above, it is also important for a semiconductor device to maintain a stable heat dissipation property and a stable electrically insulating property even when the semiconductor device is exposed to extreme conditions. However, it has been reported that peeling-off of a film occurs in a heat spreader comprising multiple films including a diamond film and the like when a semiconductor device is exposed to a cold-hot cycle between −20° C. to 150° C. (see Solid-State Electronics, Vol. 42, No.12, p2199-2208 (1998)). When the peeling-off occurs, heat dissipation property and electrically insulating property deteriorate.

A DLC film can be made at relatively low cost and has a smooth surface because of the amorphous structure thereof. However, a DLC film generally has a hardness of Hv 4000 or higher and a Young's modulus of 600 GPa or higher because the DLC film is used as a sliding material and thus should be resistant to a heavy sliding load. Therefore, the DLC film has high internal stress, and is easy to be fractured due to peeling-off or impact load. In addition, since its defect area ratio is $10^{-3}$ or higher, voltage resistance is not sufficient; specifically, it has been difficult to obtain voltage resistance of 5V or higher. Although the voltage resistance can be improved by increasing the thickness of the film, minute fracturing occurs in the film or the film peels off owing to the high internal stress and the weak adhesion to the conductive substrate. Specifically, the maximum thickness is limited to about 5 μm.

As described above, in the conventional members (such as heat sinks) which dissipate the heat generated in semiconductor elements, and in the semiconductor device using the conventional members, it has been difficult to satisfy, at a high level, all of the requirements comprising the dissipation of the heat generated in the semiconductor elements, the adhesion to the semiconductor element, the easiness of forming a thick film, the reduction of producing cost of the heat dissipating member, and the reduction of producing cost of the semiconductor device using the heat dissipating member.

DISCLOSURE OF THE INVENTION

An object of the present invention is to solve the above-mentioned problems. That is, the invention provides a semiconductor element heat dissipating member, a semiconductor device using the same, and a production method thereof, the heat dissipating member having high heat dissipation property and high adhesion property, and enabling production of a semiconductor device at a low cost.

The object can be achieved by the invention described below.

A first embodiment of the invention is a semiconductor element heat dissipating member, the heat dissipating member having an electrically insulating amorphous carbon film including a conductive substrate and hydrogen, and the electrically insulating amorphous carbon film being provided at least on a region on a surface of the conductive substrate on which region the semiconductor element is to be mounted.

The amount of hydrogen contained in the electrically insulating amorphous carbon film is preferably 20 to 60 at. %.

The electrically insulating amorphous carbon film preferably contains silicon, and the amount of silicon contained in the electrically insulating amorphous carbon film is preferably in the range of 1 to 50 at. %.

An electrically insulating organic film may be provided on a surface of the electrically insulating amorphous carbon film on which surface the semiconductor element is to be mounted.

The conductive substrate is preferably a metal substrate including at least one of Al, Cu, Mo, W, Si and Fe.

The semiconductor element is preferably a large-scale integrated circuit or a power device selected from a bipolar-type transistor, a MOS-type transistor, or a diode.

The elastic modulus of the electrically insulating amorphous carbon film is preferably 40 to 150 GPa, the Vicker's hardness of the electrically insulating amorphous carbon film is preferably Hv 400 to 1500, and the thickness of the electrically insulating amorphous carbon film is preferably 0.1 to 200 μm.

A second embodiment of the invention is a production method of the semiconductor element heat dissipating member, the method comprising a step of forming an electrically insulating amorphous carbon film containing at least hydrogen on a conductive substrate, the electrically insulating amorphous carbon film being formed by a plasma CVD method.

In a preferable example of the method, a plurality of conductive substrates connected to a negative pole are arranged in a film-forming furnace such that the conductive substrates face each other, and glow discharge is conducted with a sheath width which is adjusted such that negative glows of two adjacent conductive substrates overlap each other.

The plurality of conductive substrates may be held by a substrate holding element connected to the negative pole.

In a preferable embodiment, glow discharge is conducted while controlling the pressure of the processing gas and the plasma electrode such that negative glows of two adjacent conductive substrates overlap each other.

The sheath width is preferably within the following range:

$$D/4 \leqq S \leqq D$$

wherein S represents the sheath width and D represents the distance between the surfaces of the conductive substrates which surfaces face each other.

The pressure of the processing gas is preferably 13 to 1330 Pa, and the distance between the surfaces of two adjacent conductive substrates which surfaces face each other is preferably 2 to 60 mm.

The processing gas used for the plasma CVD method is preferably comprised of a raw material gas including a hydrocarbon gas or comprised of a raw material gas including a hydrocarbon gas and a dilution gas including hydrogen and at least one type of noble gas. The raw material gas preferably includes at least one of an organic metal containing gas including Si and a halogen compound.

If the semiconductor element heat dissipating member is produced by a process of forming an electrically insulating organic film on an electrically insulating amorphous carbon film after a process of forming the electrically insulating amorphous carbon film, the electrically insulating organic film may be formed by electrophoresis.

A third embodiment of the invention is a semiconductor device comprising at least the above-mentioned semiconductor element heat dissipating member and at least one semiconductor element mounted on the heat dissipating member.

BEST MODE FOR CARRYING OUT THE INVENTION

Figure 1A:
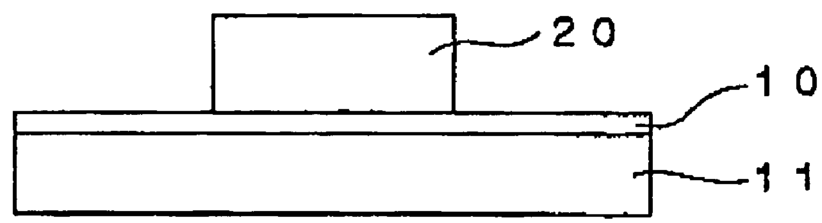
FIGS. 1A and 1B are schematic cross-sectional views showing a first example of the structure of main part of a semiconductor device according to the present invention.

Hereinafter, the present invention will be described in the order of a semiconductor element heat dissipating member, a production method thereof and a semiconductor device.

(Semiconductor Element Heat Dissipating Member)

In the invention, in a semiconductor element heat dissipating member comprising a conductive substrate on which at least one semiconductor element is to be mounted, an electrically insulating amorphous carbon film containing hydrogen is provided on a region of the conductive substrate on which the semiconductor element is to be mounted.

Therefore, the semiconductor element heat dissipating member according to the invention is superior in dissipating the heat generated in the semiconductor element and in adhesion to the semiconductor element or other members, and enables production of the semiconductor element heat dissipating member and a semiconductor device using the semiconductor element heat dissipating member at a low cost.

In the invention, the term "semiconductor element heat dissipating member" refers to a member on which a semiconductor element is mounted and which dissipates the heat generated in the semiconductor element. Specifically, a heat dissipating member refers to a heat dissipating member involved in dissipation of the heat generated in the semiconductor element such as a heat sink, a heat spread, a dissipating plate or a cooling plate.

Also, the semiconductor element heat dissipating member according to the invention has an electrically insulating amorphous carbon film formed between the conductive substrate and the semiconductor element to electrically isolate the conductive substrate from the semiconductor element. The semiconductor element is mounted on the electrically insulating amorphous carbon film, and other optional films or substrates may be provided between the conductive substrate and the electrically insulating amorphous carbon film or between the electrically insulating amorphous carbon film and the semiconductor element, in accordance with the necessity. The details will be described later.

The semiconductor element heat dissipating member of the invention has the electrically insulating amorphous carbon film at least on a region of the conductive substrate on which region the semiconductor element is to be mounted. Therefore, the structure of the semiconductor device can be simple and the layer structure can be thin with respect to the direction of the thickness of the semiconductor element, compared with a conventional semiconductor element heat dissipating member made of ceramics such as aluminum nitride. Consequently, a semiconductor device can be obtained at a low cost which is superior in dissipating the heat of the semiconductor element and which has a simple structure.

In addition, compared with a heat dissipating member using a diamond substrate or a substrate on which a diamond layer is formed, the productivity can be improved and the production cost can be decreased because the film-forming rate of the electrically insulating amorphous carbon film is higher than that of the diamond.

In addition, since diamond exposes a crystal growth face on its surface, the unevenness of the surface is large, and the surface needs polishing. Therefore, it is very difficult to secure a sufficient smoothness, and diamond has a poor compatibility with other materials. Furthermore, since diamond is a polycrystal and has grain boundaries, diamond is extremely fragile, and diamond has anisotropic properties and structure derived from respective crystals, such as anisotropic thermal expansion coefficient. On the other hand, since the electrically insulating amorphous carbon film does not have a crystal structure, the electrically insulating amorphous carbon film is isotropic and has uniform thickness, no surface unevenness, and good compatibility with other materials.

Compared with diamonds, the electrically insulating amorphous carbon film can maintain high and uniform voltage resistance when a voltage is applied in a direction of the thickness of the semiconductor element, and the electrically insulating amorphous carbon film can effectively prevent breakage of wires in the electrode layer provided in contact with the electrically insulating amorphous carbon film. This is because the electrically insulating amorphous carbon film does not have the surface unevenness derived free from the poly-crystal structure. In addition, since the electrically insulating amorphous carbon film is from isotropy of the property such as thermal expansion coefficient or of the structure, the peeling-off of the surface caused by such factors does not occur easily. Moreover, since the electrically insulating amorphous carbon film has superior compatibility with other materials, it is easy to form an electrode and the like such that the electrode contacts the electrically insulating amorphous carbon film.

JP-A Nos. 63-124555 and 2001-332798 disclose use of a pseudo diamond-like carbon (DLC) film or a diamond-like carbon (DLC) layer (hereinafter, both are collectively referred to as a "diamond like carbon (DLC) film") on a substrate made of a metal or Si, aiming at efficiently dissipating the heat generated in the semiconductor element. However, the references do not describe whether the diamond-like carbon (DLC) film has a crystallinity, nor disclose details of the physical properties, structure, and composition of the diamond-like carbon film. Further, dissimilarly from the present invention, the references do not teach intentional use of an amorphous carbon film between the conductive substrate and the semiconductor element for the purpose of achieving the above-mentioned objects; the references do not teach intentional addition (described later) of hydrogen or silicon to a carbon film, either.

In addition, the electrically insulating amorphous carbon film of the invention includes hydrogen. When the electrically insulating amorphous carbon film does not include hydrogen, the electrically insulating amorphous carbon film is fragile, whereby the electrically insulating amorphous carbon film tends to peel off the semiconductor element easily.

The content of hydrogen included in the electrically insulating amorphous carbon film is not particularly limited, and is preferably 20 at. % or higher from the viewpoint of preventing the peeling-off, more preferably 25 at. % or higher. A higher hydrogen content is preferable from the viewpoint of preventing the peeling-off since a higher content of hydrogen imparts higher flexibility to the electrically insulating amorphous carbon film. However, when the content of hydrogen is excessively high, the structure of the electrically insulating amorphous carbon film is a polymer-like structure, whereby the strength is lowered significantly to increase the possibility of occurrence of the peeling-off. From such a viewpoint, the content of hydrogen is preferably 60 at. % or lower, more preferably 40 at. % or lower.

The electrically insulating amorphous carbon film of the invention is preferably a film with a low elastic modulus in the range of 40 to 150 GPa, more preferably in the range of 60 to 120 GPa. Even when the conductive substrate undergoes elastic deformation, thermal expansion or thermal contraction, the electrically insulating amorphous carbon film with a low elastic coefficient can easily deform according to the deformation of the substrate. Therefore, the electrically insulating amorphous carbon film is unlikely to break owing to internal stress or to peel off the substrate.

The electrically insulating amorphous carbon film of the invention preferably has a Vicker's hardness of Hv 400 to 1500, more preferably Hv 600 to 1200. Even when the conductive substrate undergoes elastic deformation, thermal expansion or thermal contraction, the electrically insulating amorphous carbon film with a low Vicker's hardness of Hv 400 to 1500 can easily deform according to the deformation of the substrate. Therefore, the electrically insulating amorphous carbon film is unlikely to brake owing to occurrence of internal stress therein, or to peel off the substrate. When the elastic modulus or the hardness of the electrically insulating amorphous carbon film is too high, the above-mentioned characteristics of the electrically insulating amorphous carbon film are deteriorated. When the elastic modulus or the hardness of the electrically insulating amorphous carbon film is too low, the resistance to the load and to the friction is deteriorated.

Also, when the electrically insulating amorphous carbon film is soft, the electrically insulating amorphous carbon film deforms easily upon application of impactive force to the electrically insulating amorphous carbon film, and the deformation of the electrically insulating amorphous carbon film increases the area to be impacted, thereby reducing the surface pressure. As a result, the maximum impactive force the electrically insulating amorphous carbon film receives is reduced, and the possibility that the electrically insulating amorphous carbon film is broken is decreased.

Further, the electrically insulating amorphous carbon film preferably includes silicon as well as hydrogen in order to prevent peeling and to improve the adhesion property. When the electrically insulating amorphous carbon film includes silicon as well as hydrogen, the difference between the thermal expansion coefficient of the semiconductor element whose main component is Si and the thermal expansion coefficient of the electrically insulating amorphous carbon film can be decreased, thereby suppressing occurrence of the stress caused by the difference in thermal expansion coefficient between the semiconductor element and the electrically insulating amorphous carbon film. Therefore, it is possible to more effectively suppress occurrence of peeling particularly upon exposure to a large temperature change, than the case where the electrically insulating amorphous carbon film includes hydrogen but does not includes silicon. In addition, since residual stress of the electrically insulating amorphous carbon film can be decreased, the thickness of the electrically insulating amorphous carbon film can be increased to improve the voltage resistance, compared with an electrically insulating amorphous carbon film not including silicon.

The content of silicon contained in the electrically insulating amorphous carbon film is not particularly limited, and is preferably in the range of 1 to 50 at. %, more preferably in the range of 5 to 30 at. %. When the content of silicon is lower than 1 at. %, peeling may occur upon exposure to a large temperature change owing to an intensified stress derived from the difference in thermal expansion coefficient between the semiconductor element and the electrically insulating amorphous carbon film. On the other hand, when the content is higher than 50 at. %, the conductivity of the electrically insulating amorphous carbon film is increased, whereby it is impossible to secure the electrical isolation of the semiconductor element from the conductive substrate in some cases.

The thickness of the electrically insulating amorphous carbon film is preferably 0.1 μm or larger, more preferably 0.5 μm or larger. When the thickness is smaller than 0.1 μm, the semiconductor element cannot be electrically isolated from the conductive substrate in some cases. The maximum thickness of the electrically insulating amorphous carbon film is not particularly limited, and is preferably 200 μm or smaller. The maximum thickness is more preferably 100 μm or smaller from the viewpoint of effectively transmitting the heat generated in the semiconductor element to the conductive substrate. The maximum thickness is preferably 30 μm or smaller in consideration of the time required for forming the electrically insulating amorphous carbon film. In the invention, it is possible to form an electrically insulating amorphous carbon film having a thickness of 25 μm or larger in accordance with the necessity. This is because the amorphous carbon film does not brake or peel easily owing to a reduced stress generated upon deformation, thermal expansion or thermal contraction of the conductive substrate. The reduced stress is realized by the low elastic modulus and low hardness of the amorphous carbon film, and the low elastic modulus and low hardness is caused by increase in organic component (C—H bond), which is, in turn, caused by a relatively high content (20 to 60 at. %) of hydrogen in the amorphous carbon film.

The amorphous carbon film has a volume resistance of $10^8$ to $10^{12}$ Ω·cm, and is stable to strong acid and strong alkali. Therefore, the amorphous carbon film of the invention has an electrically insulating property and a corrosion resistance. Particularly, the defect area ratio is preferably $10^{-4}$ or lower. When the defect area ratio is $10^{-4}$ or lower, the electrically insulating amorphous carbon film has a superior insulating property and corrosion resistance, the leak current through the defects is small, and the amorphous film is an electrically insulating amorphous carbon film having a superior voltage resistance. For example, an electrically insulating amorphous carbon film with a thickness of 22 μm can have a breakdown voltage of 1200V or higher.

In addition, the electrically insulating amorphous carbon film of the invention has a thermal conductivity (about 80 W/m·K) which is as high as that of a metal, and can be directly coated on the conductive substrate. Therefore, when the electrically insulating amorphous carbon film according to the invention is used as a semiconductor element heat dissipating member, the semiconductor element heat dissipating member is simple and has an extremely low thermal conductivity, compared with a conventional laminated structure of (metal layer)-insulating plate)-metal layer)-soldering layer)-heat dissipation plate).

The electrically insulating amorphous carbon film may have a single-layered structure. Alternatively, electrically insulating amorphous carbon film may have a multi-layered structure comprised of at least two layers or a gradient structure, wherein in respective structures, there are variations in hydrogen content and/or silicon content along the direction of the thickness of the layers, in order to make higher the various characteristics required for the electrically insulating amorphous carbon film such as electrically insulating property and adhesion to the semiconductor element or to the conductive substrate.

The breakdown voltage required for the electrically insulating amorphous carbon film varies depending on the type and rating of the semiconductor element to be mounted thereon. For example, the breakdown voltage is preferably about 100 V or higher in the case of a MOS-type transistor, and is about 300 V or higher in the case of an IGBT element. When the breakdown voltage is 1000 V or higher, the electrically insulating amorphous carbon film is adaptable to any semiconductor element.

The electrically insulating amorphous carbon film of the invention described above has a superior insulating property, and the electrically insulating amorphous carbon film has a sufficiently high breakdown voltage for meeting the above requirements if the electrically insulating amorphous carbon film is formed on the predetermined region on the conductive substrate without defects.

However, in actuality, a sufficiently high voltage resistance cannot be obtained in some cases, and there is a case in which the breakdown voltage is below 100 V.

The reduction in the breakdown voltage is a phenomenon which also occurs generally in carbon films other than the electrically insulating amorphous carbon film of the invention. For example, it has been reported (in NEW DIAMOND, Vol. 14, No. 1, p19 to 23) that the breakdown voltage of a DLC (Diamond-Like Carbon) film formed on a Si substrate by a CVD method is about 50 or 70 V.

The reduction in the breakdown voltage is caused not by the inherent characteristics of the electrically insulating amorphous carbon film of the invention, but by regions (so-called "pinhole defects") in which the electrically insulating amorphous carbon film is locally thin; the pinhole defects are caused by dust adhered to the surface of the conductive substrate before formation of the electrically insulating amorphous carbon film by a vapor deposition method such as a CVD (chemical Vapor Deposition) method or caused by dust adhered to the surface of the conductive substrate in the deposition instrument.

The pinhole defects can be suppressed to a certain degree by cleaning the deposition instrument or by maintaining the deposition environment clean. However, dust may tend to occur in the deposition instrument depending on the deposition conditions (flux or pressure of the gas, power and the like). Therefore, the deposition condition is preferably adjusted such that dust hardly occurs; however, it is often difficult to suppress the occurrence of dust because of limitations on the structure of the deposition device (for example, a gas pipe system).

In order to solve this problem fundamentally, it is preferable to use an electrically insulating film made of an organic material rather than the electrically insulating amorphous carbon film which is formed by a vapor deposition. However, when an electrically insulating film made of an organic material is used instead of the electrically insulating amorphous carbon film, the thickness of the film has to be large in order to heighten the breakdown voltage. Further, the heat resistance of the electrically insulating film made of an organic material is increased because the thermal conductivity of the organic material is quite low (about 1 W/m·k).

However, in the invention, since an electrically insulating organic film is provided on the surface of the electrically insulating amorphous carbon film on which surface the semiconductor element is to be mounted, the pinhole defects are filled in by the electrically insulating organic film. Therefore, in the invention, anti-breakdown characteristics can be improved while maintaining superior heat dissipation property. Consequently, even when there are a lot of pinhole defects, it is possible to obtain a breakdown voltage of at least 100 V, and when there are few pinhole defects, it is easy to obtain a breakdown voltage of 1000 V or higher.

The electrically insulating organic film may be provided such that the electrically insulating organic film covers the entire surface of the electrically insulating amorphous carbon film on which surface the semiconductor element is to be mounted, or may be provided only on a part of the surface of the electrically insulating amorphous carbon film. When the electrically insulating organic film is provided on a part of the surface of the electrically insulating amorphous carbon film, the electrically insulating organic film is provided preferably such that the electrically insulating organic film at least fills in the region where the electrically insulating amorphous carbon film is thin due to the pinhole defects.

When the electrically insulating organic film is provided such that the electrically insulating organic film also covers the region other than the pinhole defects, the thickness of the electrically insulating organic film is not particularly limited (the thickness of the electrically insulating organic film refers to the thickness of the electrically insulating organic film in the region other than the pinhole defects). The thickness of the electrically insulating organic film is preferably 6 μm or smaller, more preferably 1 μm or smaller, most preferably 0.5 μm or smaller. When the thickness of the electrically insulating organic film is larger than 10 μm, the heat dissipating property may be deteriorated.

As a material for the electrically insulating organic film, well-known organic materials having insulation property may be used. Details of the materials and the method for forming the electrically insulating organic film will be described later.

There is no particular restriction on the conductive substrate used in the invention as long as the conductive substrate is made of a well-known metal material. The thermal conductivity of the metal material is preferably 10 W/m·K or higher, more preferably 100 W/m·K or higher.

In order to effectively dissipate the heat generated in the semiconductor element, a higher thermal conductivity of the conductive substrate is preferred; from this viewpoint, the conductive substrate preferably include at least one of Al, Cu, Mo, W, Si and Fe. The conductive substrate may be made of a simple substance of a metal such as the metal described above, or may be a complex material or mixture including such a metal, or may be an alloy such as Al—Si, Al—SiC, Cu—Mo, or Cu—W.

The semiconductor element mounted on the semiconductor element heat dissipating member of the invention is not particularly restricted as long as the semiconductor element is a conventional semiconductor element. Examples thereof include a power device such as a bipolar transistor (such as an IGBT element), an MOS transistor, or a diode, and a semiconductor chip such as a large-scale integrated circuit. Since the electrically insulating amorphous carbon film of the invention can effectively dissipate the heat generated in the semiconductor element, the electrically insulating amorphous carbon film can be suitably used for a semiconductor element with a high heat generation.

(Method of Producing Semiconductor Element Heat Dissipating Member)

A method of producing the semiconductor element heat dissipating member of the invention is not particularly limited as long as the method comprises forming the electrically insulating amorphous carbon film on the conductive substrate, wherein the electrically insulating amorphous carbon film includes hydrogen or includes hydrogen and silicon. When the electrically insulating amorphous carbon film is formed on the conductive substrate, a conventional film-forming method capable of forming an electrically insulating amorphous carbon film such as a sputtering method may be used. The electrically insulating amorphous carbon film is preferably formed by a plasma CVD method.

The plasma CVD method is able to form the electrically insulating amorphous carbon film at a high speed, whereby the productivity is high and it is possible to produce the semiconductor element heat dissipating member at a lower cost. In addition, since the CDV method is non-directional, it is possible to form a film with a uniform thickness regardless of the direction of the film formation. According to the CVD method, even when the conductive substrate has a complicated shape with convexity and concavity, it is possible to easily form an electrically insulating amorphous carbon film having a uniform thickness on any region on the conductive substrate. When the electrically insulating amorphous carbon film includes silicon in addition to hydrogen, the electrically insulating amorphous carbon film has a higher adhesion property, thereby achieving a more uniform thickness of the film.

In the plasma CVD method, voltage is applied between the positive and negative electrodes to cause glow discharge. The processing gas introduced between the two electrodes is activated by utilizing the glow discharge, so that a thin film is deposited on the negative electrode (substrate).

The substrate is not particularly restricted as long as the substrate is made of a material having conductivity. The volume resistance of the conductive substrate is preferably $10^6$ Ω·cm or lower.

The specific manner of forming the electrically insulating amorphous carbon film on the conductive substrate by the plasma CVD method is not particularly restricted as long as the electrically insulating amorphous carbon film including at least hydrogen can be formed. In a preferable embodiment, a plurality of conductive substrates connected to the negative pole are arranged such that the conductive substrates face each other in a deposition furnace, and glow discharge is conducted while adjusting the sheath widths such that the negative glows of two adjacent substrates overlap each other. Hereinafter, this embodiment will be described in detail.

The substrates are held by being fixed to a substrate holding element which is disposed in the furnace and connected to the negative electrode. The substrates are arranged such that the substrates face each other. The substrates are fixed such that at least a part of each substrate is in contact with the substrate holding element connected to the negative electrode. The shape of the substrate holding element is not particularly limited as long as the substrate holding element is made of a conductive material. Therefore, the substrate holding element may have a flat shape capable of supporting the substrates, or a shape having a fixing element capable of fixing at least a part of each substrate.

The arrangement of the substrates is not particularly restricted as long as the substrates are disposed such that the substrates face each other. When the substrates are plate-shaped, the plurality of substrates are preferably arranged in parallel along the direction of the thickness of the substrates on the substrate holding element such that the substrates are parallel to each other. A plurality of substrates can be disposed in the deposition furnace by arranging the substrates in parallel along the direction of the thickness of the substrates on the substrate holding element such that the substrates are parallel to each other, whereby it is possible to form films on the plurality of substrates by one deposition process, and to reduce the processing cost.

The deposition process is conducted on the substrates which are arranged to face each other, while controlling the pressure of the processing gas and the power source for the plasma so as to adjust the sheath width such that the negative glows of two adjacent substrates among the plurality of conductive substrates overlap each other.

The term, "sheath" used herein refers to a sheath of the plasma covering the cathode (substrate), which is a region with low light emission ranging between the cathode and the negative glow. A positive ion is accelerated toward the cathode because of the sharp drop of the electric potential in the sheath, and collides with the cathode. The collision causes release of a (second) electron from the cathode. The (second) electron is accelerated owing to the voltage gradient in the sheath, and leaves the sheath and enters the negative glow region to excite a gas molecule. The excited gas molecule emits light (glows) as the gas molecule return to the ground state. Light emission in the sheath is weak because the electron has not been sufficiently accelerated to an energy capable of exciting a gas molecule by the time the electron collides with the gas molecule. Further, the term "sheath width" used in this specification refers to the width of the region with low light emission ranging from the substrate and the substrate holding element to the negative glow. The sheath is generated along the outer surfaces of the substrate and the substrate holding element with a predetermined width (sheath width S) (see, FIG. 10).

Usually, when the surface of the substrate experiences a strong ion-impact in a film-forming process under a low pressure gas, atoms constituting the film are dispersed from the surface of the substrate into the gas. Therefore, the amorphous carbon film is a hard amorphous carbon film if the amorphous carbon film is formed in the condition in which the ion-impact is strong because soft portions are removed by the impact (sputtering) upon experiencing the ion impact. Therefore, in the formation of an amorphous film including hydrogen, soft organic portions having C—H bonds are eliminated by the ion impact, so that the resultant amorphous film is a hard amorphous carbon film with a low hydrogen content. However, when the processing pressure and the electric power are adjusted such that the negative glows of two adjacent substrates overlap each other, the discharge is stable and the discharge with a low voltage and a high current density (high density plasma) occurs in the region in which the negative glows overlap each other. In the discharge with a low voltage and a high current density, the ion impact is weak and the impact on the soft portions of the film is weak. As a result, it is thought that a film with a high hydrogen content can be formed. Such a film is soft supposedly because: a higher content of hydrogen in the film increases the organic component (C—H bond), and the three-dimensionally extending network of —C—C—C—C— bond is terminated by hydrogen to form —C—C—H H—C—C—, thereby softening the film. In addition, since damage of film during the film formation is reduced, a dense film with few defects can be formed. Since the film has a defect area ratio of $10^{-4}$ or lower even when the film is as thin as 0.1 μm, the film can be used as an excellent protective film. Moreover, since sputtering of the film during the film formation is suppressed, it is possible to form the film at a high rate (up to about 10 μm/h). As described above, the method of the invention for forming an amorphous carbon film enables formation of an amorphous carbon film with a low elasticity, a low hardness, and few defects.

When the sheath width is equal to or shorter than the distance between the surfaces of two adjacent substrates which surfaces face each other and is equal to or larger than one-fourth of the distance between the surfaces facing each other, the negative glows overlap each other, thereby enabling excellent film formation. This condition can be expressed as:

$$D/4 \leq S \leq D$$

wherein S represents the sheath width and D represents the distance between the surfaces of the substrates facing each other.

On the contrary, when the sheath width is larger than the distance between the surfaces of two adjacent substrates facing each other, negative glows along the surfaces of the substrates facing each other are not formed, whereby the film-forming rate is quite low.

The plurality of substrates are preferably arranged such that the distance between the surfaces of two adjacent substrates facing each other is in the range of 2 to 60 mm. When the distance is less than 2 mm, the overlap of the negative glows is large, whereby the glow discharge may be locally strong or unstable depending on the film-forming condition. When the distance is larger than 60 mm, the glow discharge is stable; however, since the overlap of the negative glows is reduced or eliminated, such a distance may be non-preferable depending on the film-forming condition. The distance between the surfaces of two substrates facing each other is preferably 2 to 60 mm, more preferably 3 to 40 mm, most preferably 5 to 30 mm. The sheath width is preferably 1 to 60 mm, more preferably 1.5 to 40 mm, and most preferably 2.5 to 30 mm. In order adjust the sheath width within the above-mentioned range, the pressure of the processing gas is adjusted at 13 to 1330 Pa, more preferably 66.5 to 1064 Pa, most preferably 133 to 798 Pa.

The film-forming temperature is preferably 500° C. or lower, more preferably 200 to 450° C. When the film-forming temperature is too high, film-forming active species reaching the substrate are likely to return to the atmosphere, thereby lowering the film-forming rate. In addition, when the film-forming temperature is too low, subtle arc occurs which inhibits stable glow discharge. Herein, the film-forming temperature refers to the temperature of the surface of the substrate during the film-formation.

The processing gas is preferably comprised of a raw material gas or comprised of a raw material gas and a dilution gas. The type, mixing ratio and flowing ratio of the processing gas may be selected properly so as to obtain the desired composition of the amorphous carbon film. For example, for obtaining an amorphous carbon film including silicon, the raw material gas may be an organic-metal containing gas containing silicon or a halide gas.

Raw material gas includes at least hydrocarbon gas, and preferably further includes at least one of an organic-metal containing gas containing silicon and a halogen compound. The hydrocarbon gas is preferably a saturated hydrocarbon such as methane ($CH_4$) or ethane ($C_2H_6$), an unsaturated hydrocarbon such as ethylene ($C_2H_4$) or acetylene ($C_2H_2$), or an aromatic hydrocarbon such as benzene. In addition, the organic-metal containing gas is preferably tetramethylsilane ($Si(CH_3)_4$: TMS) or silane, and the halogen compound may be a silicon chloride, preferably $SiCl_4$.

Examples of the dilution gas include hydrogen, a noble gas, an inert gas such as nitrogen. A mixture thereof is also usable. The dilution gas is preferably comprised of hydrogen, He or Ne, more preferably comprised of hydrogen only. When the film-formation is conducted without using a noble gas having a large atomic weight such as argon, the impact the film experiences is reduced to suppress deterioration of the film during the film-formation, whereby a soft film with few defects can be formed at a high rate.

When the electrically insulating organic film is formed on the electrically insulating amorphous carbon film in order to improve the anti-breakdown characteristics, electrically insulating organic film may be formed by a conventional method. However, in order to ensure that the electrically insulating amorphous carbon film is coated with the electrically insulating organic film such that the electrically insulating organic film fills in the pinhole defects, it is preferable to use a liquid-phase film-forming method, more preferable to use a method utilizing electrophoresis.

When electrophoresis is utilized, the electrically insulating organic film can be formed in the following way.

The conductive substrate with the electrically insulating amorphous carbon film formed thereon is dipped in an electrodeposition liquid including the raw material (electrodeposition component) for constituting the electrically insulating organic film. Then, voltage is applied to the conductive substrate with the electrically insulating amorphous carbon film formed thereon, via a lead wire which has been connected to the conductive substrate or via an electrode immersed in the electrodeposition liquid, so that the electrodeposition component contained in the electrodeposition liquid is electrodeposited to form an electrodeposition film. Thereafter, unreacted components contained in the electrodeposition film is removed, and then the electrodeposition film is dried and heated to form the electrically insulating organic film filling in the pinhole defect portions and covering the other portions.

The electrodeposition component contained in the electrodeposition liquid may be a conventional electrodepositable water-soluble organic substance. Examples thereof include a polyimide obtained by mixing a soluble polyimide and an amine-modified acryl polymer to form a complex, a modified epoxy resin on which amine-addition has been conducted, and a cationic particle whose base resin is a modified epoxy resin which contains blocked isocyanate and which amine-addition has been conducted on.

The components contained in the electrodeposition liquid other than the electrodeposition component may include, in addition to water, a known water soluble organic solvent as another solvent component, an acid such as acetic acid or lactic acid, or a salt such as a silicate or aluminum phosphate.

(Semiconductor Device)

The semiconductor device of the invention is not particularly limited as long as the semiconductor device comprises the above-described semiconductor element heat dissipating member of the invention and a semiconductor element mounted at least on the region of the semiconductor element heat dissipating member, the region having the electrically insulating amorphous carbon film formed thereon. Alternatively, the semiconductor device of the invention may have a structure other than the above-described structure. The number of the semiconductor element(s) mounted on the semiconductor element heat dissipating member may be one, or may be two or more.

The heat transmitted from the semiconductor element to the conductive substrate via the electrically insulating amorphous carbon film may be dissipated naturally or may be forcibly cooled by utilizing a known cooling method such as air-cooling or water-cooling. In the latter case, the conductive substrate may have such a cooling function, or a cooling member for cooling the conductive substrate may be provided such that the cooling member contacts the region of the conductive substrate which the region does not have the semiconductor element thereon.

Hereinafter, the semiconductor device of the invention will be described in detail with reference to the drawings. However, the structure of the semiconductor device of the invention is not limited thereto.

Figure 1B:
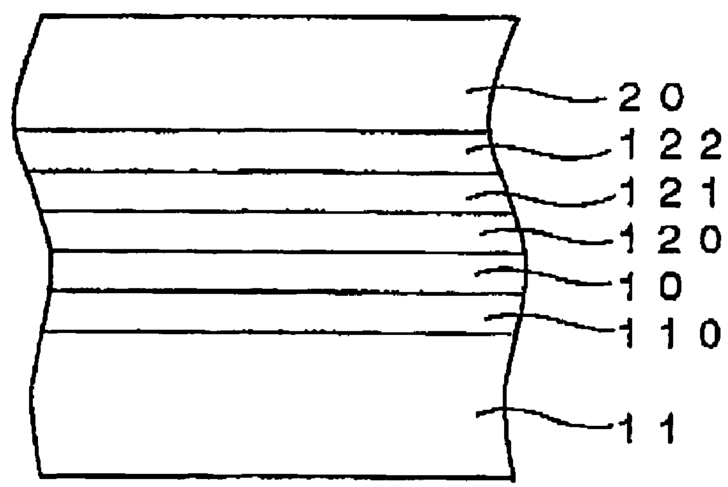

FIGS. 1A and 1B are schematic cross-sectional views showing an example of the structure of the main part of the semiconductor device according to the invention. FIG. 1A shows a rough structure of the main part of the semiconductor device, and FIG. 1B shows details of the structure of the main part of the semiconductor device (the layer structure in the direction of the thickness of the semiconductor element). In FIGS. 1A and 1B, reference number 10 denotes an electrically insulating amorphous carbon film, reference number 11 denotes a heat dissipating plate (a conductive substrate), reference number 20 denotes a semiconductor element, reference numbers 110, 120 and 121 denote intermediate layers, reference number 122 denotes a soldering layer, and reference number 200 denotes a semiconductor device, respectively.

As shown in FIG. 1B, in the semiconductor device 200, the electrically insulating amorphous carbon film 10 is disposed on the intermediate layer 110 which is disposed on the dissipating plate 11, the intermediate layers 120 and 121 and the soldering layer 122 are disposed in this order on the electrically insulating amorphous carbon film 10, and the semiconductor element 20 is further disposed thereon. In FIGS. 1A and 1B and in the following description of the semiconductor device, “up”, “upper side” and “upper surface” represent a surface on the side of the conductive substrate on which side the semiconductor element is mounted or the direction from the conductive substrate to the semiconductor element, and “low”, “lower side” and “lower surface” represent the side of the conductive substrate which side is the opposite to the side having the semiconductor element or the direction which is opposite to the direction from the conductive substrate to the semiconductor element.

The semiconductor device 200 can be produced, for example in the following way. First, the intermediate layer 110, the electrically insulating amorphous carbon film 10, the intermediate layer 120, and the intermediate layer 121 are formed successively on the heat dissipating plate 11. Then, the semiconductor device 200 can be obtained by soldering the semiconductor element 20 to the intermediate layer 121. Here, the semiconductor element 20 has an intermediate layer (not shown) provided, in advance, on the surface to be soldered.

The heat dissipating plate (the conductive substrate) 11 is made of a metal material as described above, and may be, for example, a Cu—Mo alloy substrate or an Al—Si alloy substrate.

Further, the intermediate layer 110 is provided in order to enhance the adhesion between the heat dissipating plate 11 and the electrically insulating amorphous carbon film 10, and the intermediate layers 120 and 121 are provided in order to enhance the adhesion between the semiconductor element 20 and an electrode provided between electrically insulating amorphous carbon film 10 and the semiconductor element 20 or in order to enhance the adhesion between the electrically insulating amorphous carbon film 10 and the semiconductor element 20. These layers may be omitted in accordance with the necessity. The structure may be other than the above-described structure.

The intermediate layer 110 may be, for example, made of a metal such as Ti, Cr, Si, or Al, or a nitride of such a metal, or a carbide of such a metal, and formed on the heat dissipating plate 11 by a plasma CVD method, a sputtering method, or the like. The intermediate layer 120 is formed on the surface of the electrically insulating amorphous carbon film 10 from a metal comprised of Ti and the like by a sputtering method or the like. The intermediate layer 121 is formed on the surface of the intermediate layer 120 from a metal comprised of Cu and the like by a sputtering method, a plating method, or the like. The thicknesses of the intermediate layers 110, 120 and 121 are not particularly limited, and are preferably in the range of 0.01 to 50 μm.

In the semiconductor device 200, an air-cooling or water-cooling cooling member may be provided in order to forcibly cool the heat generated in the semiconductor element 20 and transmitted to the heat dissipating plate 11, such that the cooling member is adhered to the lower surface of the heat dissipating plate 11. When such a cooling member is provided, the heat generated in the semiconductor element 20 can be dissipated more effectively.

The adhesive material used for the adhesion of the cooling member may be, for example, grease, wax, or the like, and is preferably wax because of its low thermal resistance.

Figure 7A:
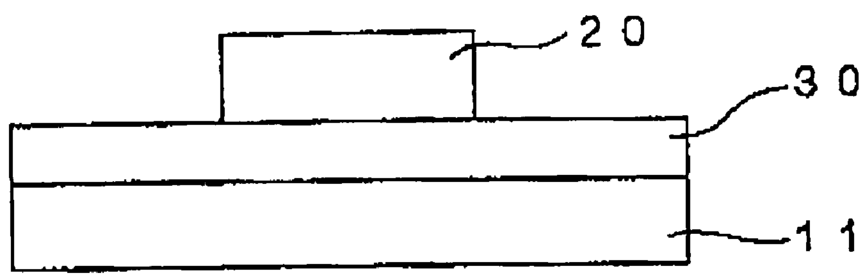
FIGS. 7A and 7B are schematic cross-sectional views showing an example of the structure of the main part of a conventional semiconductor device.
Figure 7B:
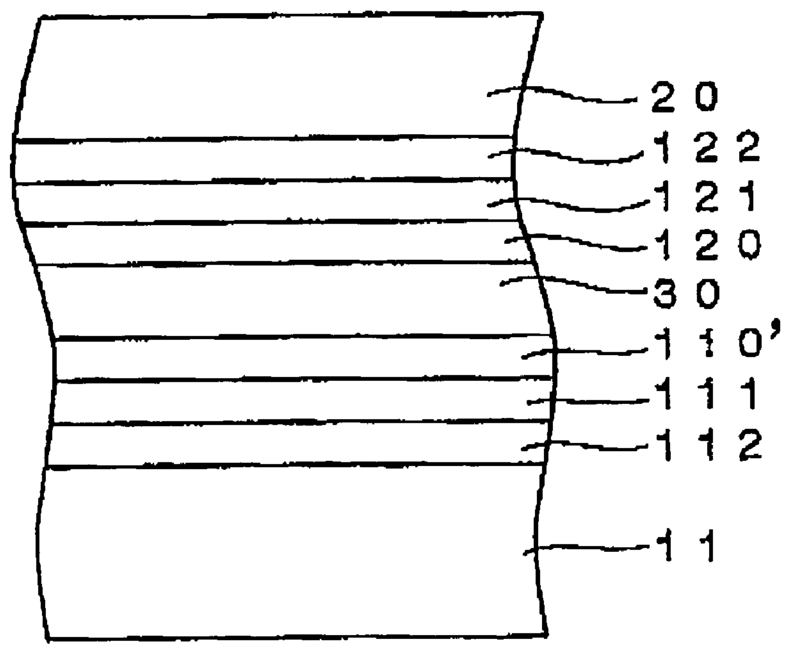

Next, the structure of the main part of a conventional semiconductor device will be described below with reference to the drawings. FIGS. 7A and 7B are schematic cross-sectional views of an example of the structure of the main part of a conventional semiconductor device. FIG. 7A shows the outline of the structure of the semiconductor device, and FIG. 7B shows details of the structure of the semiconductor device (the layer structure in the direction of the thickness of the semiconductor element). In the FIGS. 7A and 7B, reference number 30 denotes an electrically insulating plate, reference number 110' denotes an intermediate layer, reference number 111 denotes another intermediate layer, reference number 112 denotes a soldering layer, and reference number 300 denotes a semiconductor device. The intermediate layer 111 has the substantially same function and structure as those of the intermediate layer 121 shown in the FIG. 1B, and the members with the same reference numbers as those shown in FIG. 1B have the substantially same functions and structures as in FIG. 1B, except for the members with reference numbers 110', 111, 112 and 300. The electrically insulating plate 30 is comprised of a plate-shaped electrically insulating material such as AlN, diamond or the like and is provided for electrically insulating the semiconductor element 20 from the heat dissipating plate 11.

As shown in FIGS. 7A and 7B, in the semiconductor device 300, the soldering layer 112, the intermediate layer 111 and the intermediate layer 110' are disposed in this order on the heat dissipating plate 11, and the electrically insulating plate 30 is disposed thereon, the intermediate layer 120, the intermediate layer 121 and the soldering layer 122 are disposed in this order on the electrically insulating plate 30, and the semiconductor element 20 is disposed thereon.

The semiconductor device 300 is produced, for example, as follows. First, the intermediate layer 110 and the intermediate layer 111 are formed successively on one side of the electrically insulating plate 30, and the intermediate layer 120 and the intermediate layer 121 are successively formed on the other side of the electrically insulating plate 30. Then, the heat dissipating plate 11 is adhered, by soldering, to the side of the electrically insulating plate 30, the side having the intermediate layer 111 formed thereon; and the semiconductor element 20 is soldered to the side of the electrically insulating plate 30, the side having the intermediate layer 121 formed thereon; whereby the semiconductor device 300 can be obtained. The semiconductor element 20 has an intermediate layer (not shown) provided in advance on the side to be soldered.

The semiconductor device 200 of the invention shown in FIG. 1A and the conventional semiconductor device 300 shown in FIG. 7A have almost the same main constitution except for the difference in the member insulating the semiconductor element 20 and the heat dissipating plate 11. However, when both are compared, the semiconductor device 200 has simpler layer constitution than the semiconductor device 300, and the production of the semiconductor device 200 requires one-time soldering while that of the semiconductor device 300 requires two-time soldering; therefore, the production of the semiconductor device 200 is easier than the production of the semiconductor device 300.

Moreover, while the thickness of the electrically insulating film 30 is about several hundreds μm, the thickness of the electrically insulating amorphous carbon film 10 is about 0.1 to several tens μm as described above, and the layer constitution of the semiconductor device 200 is simpler than that of the semiconductor device 300 as described above. Therefore, distance between the semiconductor element 20 and the heat dissipating plate 10 can be smaller in the semiconductor device 200 than in the semiconductor device 300, the heat dissipation efficiency can be improved upon transmission of the heat generated in the semiconductor element 20 to the heat dissipating plate 10 for dissipating the heat.

In this case, when the same amount of heat is generated by the semiconductor element 20 upon application of electric power, the semiconductor element 20 of the semiconductor device 200 can maintain the temperature lower than the semiconductor element 20 of the semiconductor device 300 can; accordingly, it is less likely that the semiconductor element 20 of the semiconductor device 200 is broken by excessive temperature elevation such as short-circuit resistance or avalanche resistance than that of the semiconductor device 300.

In addition, when the highest tolerable temperature for the semiconductor element 20 is the same, the semiconductor element 20 of the semiconductor device 200 can transmit more electric current than the semiconductor element 20 of the semiconductor device 300. Therefore, when an equivalent semiconductor element 20 is used, the semiconductor device 200 can control larger electric current than the semiconductor device 300, whereby the number of semiconductor elements to be used can be decreased and the cost can be reduced when the semiconductor device comprises a plurality of semiconductor elements.

When the conventional semiconductor device has a semiconductor element heat dissipating member comprising the conductive substrate and a diamond film provided thereon, the diamond film is provided in the portion represented by the reference number 10 of the semiconductor device 200 shown in FIG. 1A. When the diamond film is used, the resultant semiconductor device can have the same constitution as that of the semiconductor device of the invention. However, the time required for forming a diamond film is several times to several tens of times the time required for forming an electrically insulating amorphous carbon film having the same thickness. In addition, it is necessary to conduct an additional polishing process for making the surface of the diamond film smooth after formation of the diamond film. In contrast, since electrically insulating amorphous carbon film is used in the semiconductor device of the invention, the time required for forming the film of the electrically insulating member represented by the reference number 10 is short, and the above-mentioned polishing process is unnecessary, whereby the production cost can be reduced.

Figure 2:
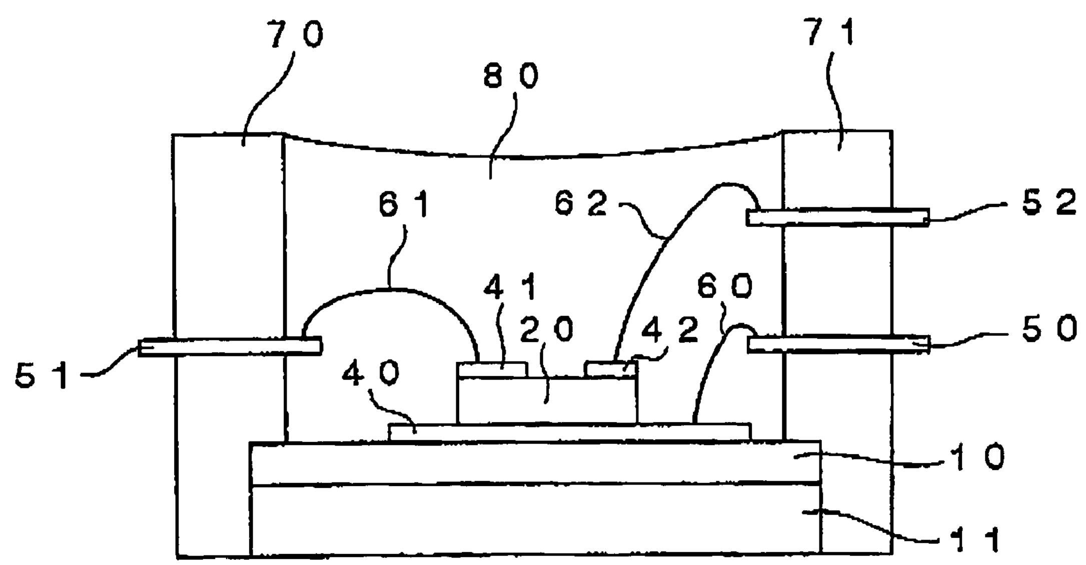
FIG. 2 is a schematic cross-sectional view showing the structure of the first example of the semiconductor device according to the invention, the structure including parts other than the main part.

Next, a more detailed structural example of the semiconductor device based on the structure of the semiconductor device shown in FIGS. 1A and 1B will be described below. FIG. 2 is a schematic cross-sectional view showing another example of the semiconductor device of the invention. Specifically, FIG. 2 shows other elements such as the part surrounding the main part and wiring, as well as the structure of the main part of the semiconductor device shown in FIG. 1A.

In FIG. 2, reference numbers 40 to 42 denote extraction electrodes, reference numbers 50 to 52 denote bus bars, reference numbers 60 to 62 denote wires, reference numbers 70 and 71 denote resin blocks, reference number 80 denotes a sealing gel, reference number 201 denotes a semiconductor device, and members represented by the other reference numbers are members having the same functions and structures as in FIGS. 1A and 1B. Although the other layers formed between the heat dissipating plate 11 and the electrically insulating amorphous carbon film 10 are not shown, they are the same as in FIG. 1B. The extraction electrode 40 shown in FIG. 2 is a member corresponding to the intermediate layers 121 and 122 shown in FIG. 1B, and the illustration of the soldering layer provided between the extraction electrode 40 and the semiconductor element 20 is omitted.

In the semiconductor device 201, the electrically insulating amorphous carbon film 10 is provided on the dissipating plate 11 such that the electrically insulating amorphous carbon film 10 covers the entire surface of the dissipating plate 11, and the semiconductor element 20 is mounted on the extraction electrode 40, which is provided on the electrically insulating amorphous carbon film 10. In the semiconductor device 201 shown in FIG. 2, the electrically insulating amorphous carbon film 10 is provided such that the electrically insulating amorphous carbon film 10 covers the entire surface of the heat dissipating plate 11; however, it is not necessary for the electrically insulating amorphous carbon film 10 to cover the entire surface of the heat dissipating plate 11, as long as the electrically insulating amorphous carbon film 10 electrically insulate the semiconductor element 20 from the heat dissipating plate 11.

The extraction electrodes 41 and 42 are disposed on the opposite side of the semiconductor element 20 to the side having the extraction electrode 40 provided thereon. The resin blocks 70 and 71 are disposed on both sides of the heat dissipating plate 11 such that the heat dissipating plate 11 forms the base of a "recess" and that the resin blocks 70 and 71 form sides of the recess.

The bus bar (for an emitter) 51 is disposed in the middle of the resin block 70 such that the bus bar 51 penetrates the resin block 70 in the lateral direction, and the bus bar 51 is connected via the wire 61 to the extraction electrode 41, which corresponds to the emitter electrode of the semiconductor element 20. In addition, the bus bar (for a collector) 50 is disposed in the middle of the resin block 71 such that the bus bar 50 penetrates the resin block 70 in the lateral direction, and the bus bar (for a gate) 52 is disposed above the bus bar 50 such that the bus bar 52 penetrates the resin block 71 in the lateral direction. The bus bar 50 is connected via the wire 60 to the extraction electrode 40, which corresponds to the collector electrode of the semiconductor element 20, and the bus bar 52 is connected via the wire 62 to the extraction electrode 42, which corresponds to the gate electrode of the semiconductor element 20 (wherein, the lateral direction refers to the direction of the width of the conductive substrate, and the meaning of this term is the same in the following description of the semiconductor device).

The space surrounded by the heat dissipating plate 11, the resin block 70, and the resin block 71 is filled with the sealing gel 80 so as to shield the electrically insulating amorphous carbon film 10, the semiconductor element 20, the extraction electrodes 40 to 42, the bus bars 50 to 52, the wires 60 to 62 and the resin blocks 70 and 71, which contact the space, from the external air.

Figure 3:
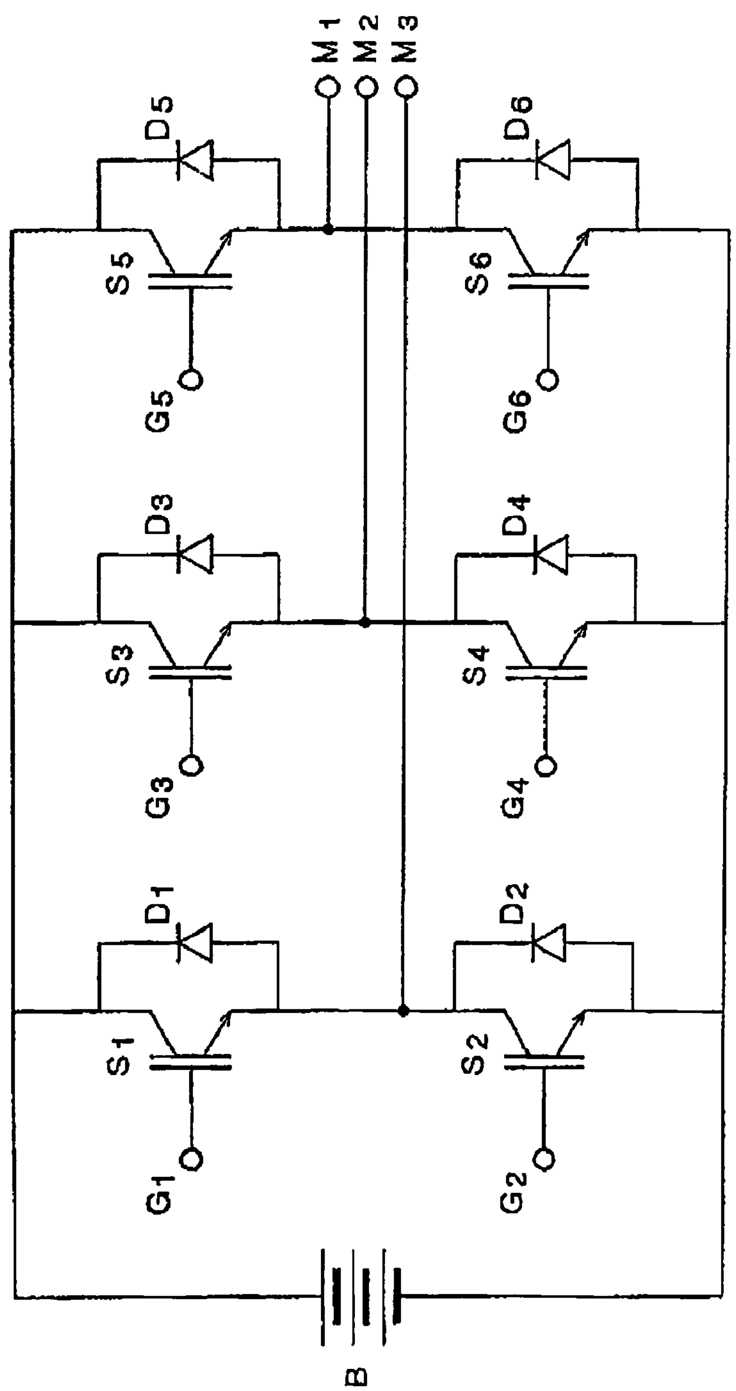
FIG. 3 is a schematic view showing an example of a circuit diagram of the semiconductor device shown in FIG. 2.

In a constitution such as the semiconductor device 201 shown in the FIG. 2, if the semiconductor device 201 has a plurality of semiconductor elements (for example, six IGBT elements) or diodes mounted on one semiconductor element heat dissipating member comprised of the heat dissipating plate 11 and the electrically insulating amorphous carbon film 10, the circuit constitution of the semiconductor device 201 can be, for example, as FIG. 3.

FIG. 3 is a schematic diagram showing an example of the electric circuit of the semiconductor device shown in FIG. 2. In FIG. 3, B represents a power supply, D1 to D6 represent diodes, S1 to S6 represent IGBT elements (corresponding to the semiconductor element 20 in FIG. 2), G1 to G6 represent gate electrode terminals, and M1 to M3 represent motor terminals (forming three-phase inverter). Moreover, G1 to G6 and M1 to M3 are connected, by wires (not shown), to circuits and/or motors (not shown) provided outside the semiconductor device.

Figure 4:
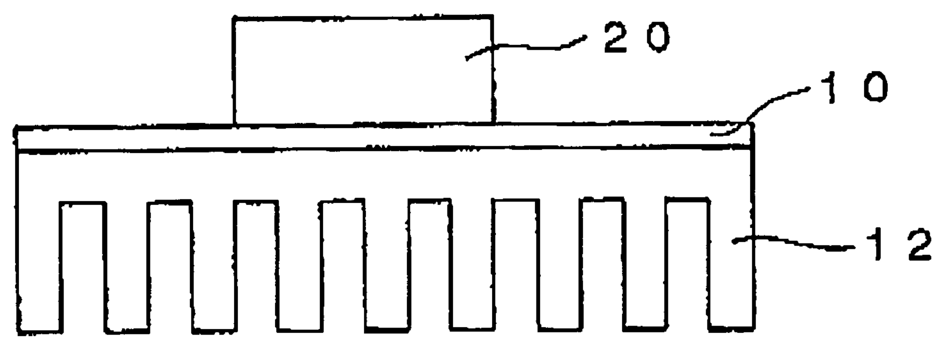
FIG. 4 is a schematic cross-sectional view showing a second example of the structure of the main part of the semiconductor device according to the invention.

Next, a semiconductor device with a different structure from that of the semiconductor device 200 shown in FIG. 1A will be described. FIG. 4 is a schematic cross-sectional view showing another example of the structure of the main part of a semiconductor device of the invention. In FIG. 4, reference number 10 represents an electrically insulating amorphous carbon film, reference number 12 represents a cooling plate (conductive substrate), reference number 20 represents a semiconductor element, and reference number 210 represents a semiconductor device. Similarly to the semiconductor device 200 shown in FIG. 1A, the intermediate layers 120 and 121, and the soldering layer 122 are successively provided on the electrically insulating amorphous carbon film 10 such that the intermediate layers 120 and 121 and the soldering layer 122 are located between the semiconductor element 20 and the electrically insulating amorphous carbon film 10 in FIG. 4, though these layers are not shown in FIG. 4.

The semiconductor device 210 has a constitution in which the electrically insulating amorphous carbon film 10 is disposed on a flat surface of the cooling plate (conductive substrate) 12, the other surface of the cooling plate being fin-shaped. In the constitution, the semiconductor element 20 is disposed on the electrically insulating amorphous carbon film 10 such that the unshown intermediate layers and soldering layer are located between the semiconductor element 20 and the electrically insulating amorphous carbon film 10.

The semiconductor device 210 can be produced, for example, as follows. First, the electrically insulating amorphous carbon film 10 is formed on the flat side of the cooling plate 12 (conductive substrate), the other side of which has been processed to be fin-shaped. Then, the intermediate layers are formed thereon by a method such as the above-mentioned method. Thereafter, the semiconductor element 20 is adhered to the intermediate layers by soldering, so that the semiconductor device 210 is obtained.

The semiconductor device 210 can forcibly dissipate, to the outside of the semiconductor element 210, the heat transmitted from the semiconductor element 20 to the cooling plate 12, by bringing the fin-shaped portion having a high heat dissipation efficiency into contact with a fluid or the like such as air. On the other hand, the cooling plate 12 similar to that shown in FIG. 4 can be provided on the lower side of the dissipating plate 11 of the semiconductor device 200 or of the semiconductor device 300 by soldering or the like such that the fin shaped side faces downward.

However, the semiconductor 210 has a simple structure as a whole and also has superior heat dissipation property owing to the short distance between the semiconductor 20 and the cooling plate 12 functioning as a forcible cooing member of the semiconductor element 20, compared to the semiconductor device 200 and the semiconductor device 300.

In the semiconductor device 200, when the cooling plate 12 is provided on the lower side of the heat dissipating plate 11, the thermal expansion coefficient of the heat dissipating plate 11 may be adjusted such that the thermal expansion coefficient of the heat dissipating plate 11 is between the thermal expansion coefficient of the electrically insulating amorphous carbon film 10 and the thermal expansion coefficient of the cooling plate 12; by this adjustment, thermal stress generated among the three members can be relaxed effectively even when the difference between the temperature of the heated semiconductor element 20 and the temperature of the neighborhood of the fin portion of the cooling plate 12 is large.

The material for the cooling plate (conductive substrate) 12 may be a metal material such as the above-mentioned metal materials. From the viewpoint of easy processing into fin-shape, the material for the cooling plate 12 is preferably an Al alloy, which is excellent in castability and plasticity processibility.

Figure 5:
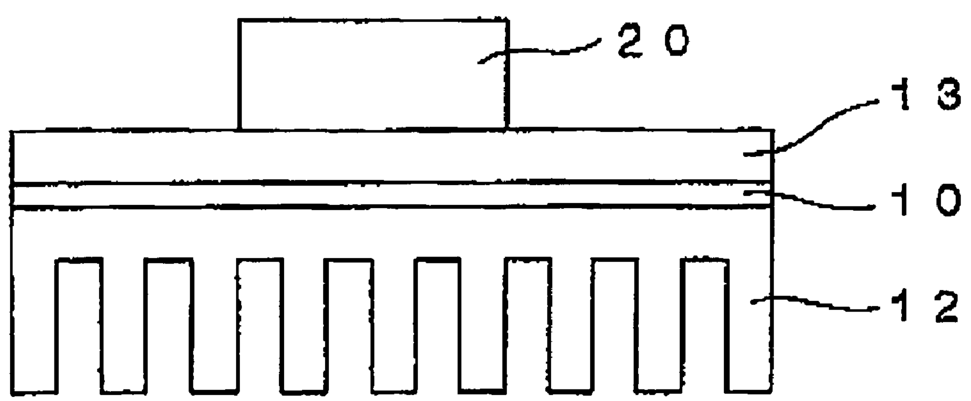
FIG. 5 is a schematic cross-sectional view showing a third example of the structure of the main part of the semiconductor device according to the invention.

Next, another exemplary constitution will be described which is based on the constitution of the semiconductor device 210 shown in FIG. 4. FIG. 5 is a schematic cross-sectional view showing another example of the structure of the main part of a semiconductor device of the invention. In FIG. 5, reference number 13 represents a heat dissipating plate, reference number 220 represents a semiconductor device, and the other reference numbers represent the same members as in the semiconductor device 210 shown in FIG. 4.

In FIG. 5, there is a soldering layer provided between the semiconductor element 20 and the heat dissipating plate 13, though the soldering layer is not shown in FIG. 5. In FIG. 5, the intermediate layers 110 and 111, and the soldering layer 112 are successively provided between the electrically insulating amorphous carbon film 10 and the cooling plate 12 such that the intermediate layers 110 and 111 and the soldering layer 112 are disposed in this order from the electrically insulating amorphous carbon film 10 side to the cooling plate 12 side, though these layers are not shown in FIG. 5. The heat dissipating plate 13 is made of a metal similar to the conductive substrate represented by the reference number 11 or 12, and may be, for example, a Si—Al alloy substrate. The thickness of the heat dissipating plate 13 is preferably about 0.1 to 5 mm.

The semiconductor device 220 can be produced, for example, as follows. First, the electrically insulating amorphous carbon film 10 is formed on a surface of the heat dissipating plate 13, and then the intermediate layers 110 and 111 are successively formed on the surface of heat dissipating plate 13 having the electrically insulating amorphous carbon film 10 formed thereon, similarly to the semiconductor device 300 shown in FIG. 7B. Thereafter, the flat surface of the cooling plate 12 is soldered to the intermediate layer 111. Lastly, the semiconductor element 20 is soldered to the opposite surface of the heat dissipating plate 13 to the surface having the electrically insulating amorphous carbon film 10 formed thereon, thereby obtaining the semiconductor device 220.

In the semiconductor device 220, the heat dissipation plate 13 can be used as an electrode; therefore, the intermediate layers 120 and 121 provided on the upper side of the electrically insulating amorphous carbon film and serving as the electrode layer are unnecessary, and the heat dissipating plate 13 serving as the electrode is thick, thereby reducing the electric resistance upon application of a large electric current to the semiconductor element 20, compared to the semiconductor device 200 shown in FIG. 1A.

Figure 13A:
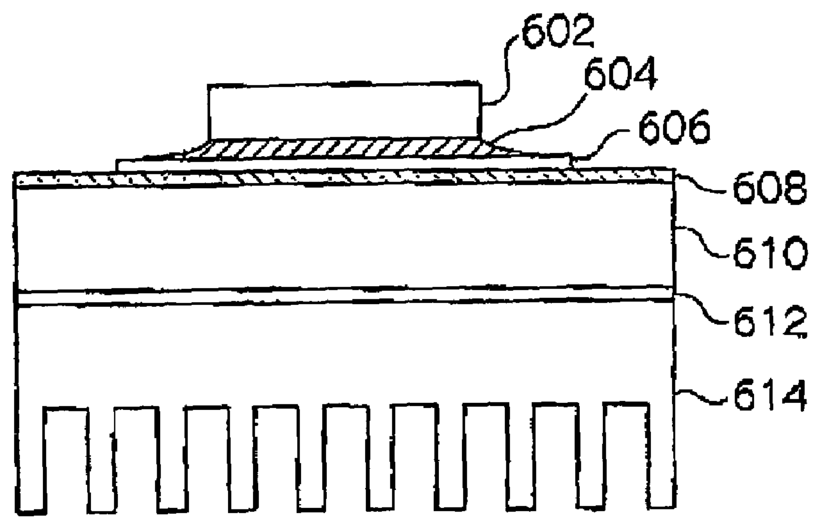
FIG. 13A is a schematic cross-sectional view showing a fourth example of the structure of the main part of the semiconductor device according to the invention.
Figure 13B:
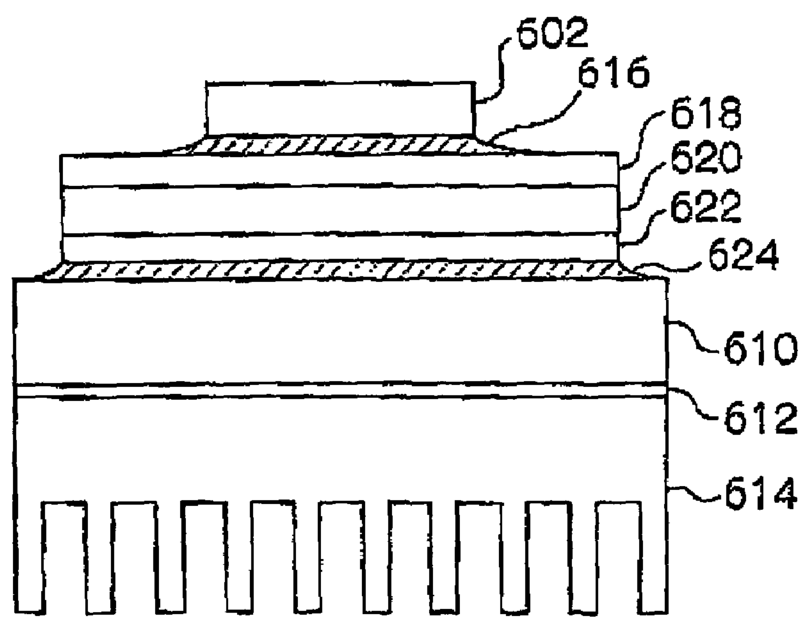
FIG. 13B is a schematic cross-sectional view showing an example of the structure of the main part of the semiconductor device having a conventional semiconductor element heat dissipating member, which heat dissipating member uses an aluminum nitride insulating plate.

FIG. 13A is a schematic cross-sectional view showing a fourth example of the structure of the main part of the semiconductor device of the invention, and FIG. 13B is a schematic cross-sectional view showing an example of the structure of the main part of a semiconductor device comprising a conventional semiconductor element heat dissipating member in which an electrically insulating plate of aluminum nitride is used. In FIG. 13A, a thick electrically insulating amorphous carbon film 608 is formed on and integrated with the heat dissipating plate (Cu—Mo) 610. Reference number 602 represents an IGBT element, reference number 604 represents a soldering layer, reference number 606 represents an electrode, reference number 612 represents grease, and reference number 614 represents an aluminum cooling plate. On the other hand, FIG. 13B shows a conventional structure where a 0.4 mm-thick aluminum nitride films (618 and 622) are formed on both sides of an electrically insulating aluminum nitride plate 620. Reference numbers 616 and 624 represent soldering layers.

EXAMPLES

In the following, the present invention will be described more specifically by using Examples. However, the invention is by no means limited to the Examples described below.

Example 1

In Example 1, an example is described in which a semiconductor device with a similar structure to that of the semiconductor device shown in FIG. 1A was produced through a process of forming an electrically insulating amorphous carbon film on a conductive substrate by a plasma CVD method, and in which the semiconductor device was evaluated.

<Production of Semiconductor Device>

A metal plate containing 35 at. % of Cu and 65 at. % of Mo was processed to form a plate with a length of about 9 mm, a width of about 13 mm, and a thickness of 3 mm, thereby obtaining a heat dissipating plate (conductive substrate) for a semiconductor element heat dissipating member. Next, the heat dissipating plate was cleaned, and then a Cr film having a thickness of 0.2 μm was formed on one side of the heat dissipating plate by a sputtering method.

Then, the heat dissipating plate having the Cr film formed on one side thereof was laid on a sample stage in a vacuum chamber of a plasma CVD apparatus, and the vacuum chamber was deaerated to $1.3\times10^{-2}$ Pa or lower. Then, 50 sccm of methane and 4 sccm of tetramethlsilane were introduced as raw material gases, and 30 sccm of Ar and 30 sccm of hydrogen were introduced as dilution gases. The total pressure was maintained at 533 Pa, and then a DC voltage was applied between the sample stage and the counter electrode to form an electrically insulating amorphous carbon film containing hydrogen and silicon with a film thickness of about 3 μm on the surface of the Cr layer formed on one side of the heat dissipating plate. The time taken to form the electrically insulating amorphous carbon film was about 30 minutes, which was very short compared with the time required for forming a diamond layer having the same thickness. Further, the content of hydrogen contained in the electrically insulating amorphous carbon film was measured by an ERD method (Elastic Recoil Detection method) and found to be 30 at. %, and the content of silicon was measured by an EPMA (Electron Probe Micro Analyzer) and found to be 16 at. %.

The crystallinity of the electrically insulating amorphous carbon film was evaluated by an X-ray diffraction using a Cu tube at an acceleration voltage of 40 kV, an electric current of 300 mA, and a diffraction angle detection zone of 10° to 80°. As a result, sharp diffraction lines were not observed except for the diffraction lines derived from Cu and Mo, which were components of the conductive substrate, and from Cr in the Cr film. Accordingly, it was confirmed that the electrically insulating amorphous carbon film was amorphous.

Then, an Al film having a thickness of about 1 μm was formed as an electrode on the electrically insulating amorphous carbon film by a sputtering method, and a Ni film having a thickness of about 2 μm was formed on the Al film by a plating method. Lastly, an IGBT element with the same length and width as those of the heat dissipating plate was provided on the surface of the Ni film by soldering to form a semiconductor device of Example 1 (hereinafter, referred to as a “semiconductor device A”).

<Evaluation>

Figure 6:
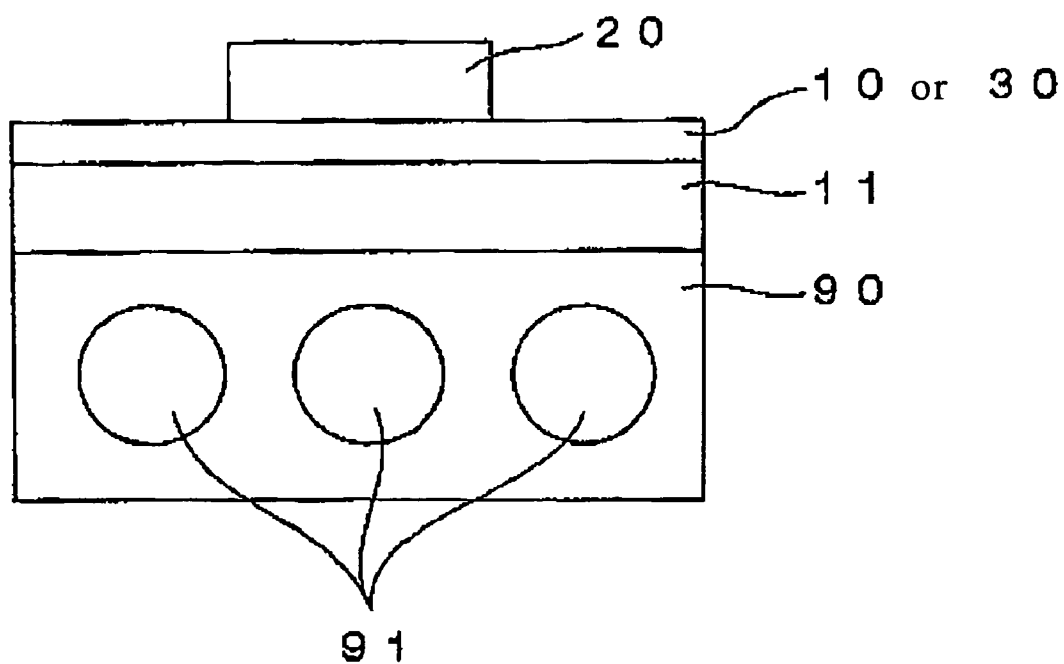
FIG. 6 is a schematic cross-sectional view showing an example in which a semiconductor device with a heat dissipation plate is mounted on a cooling block.

As shown in FIG. 6, the semiconductor device A was fixed on a cooling block. Then, the power supply voltage was applied between the emitter and collector of the IGBT element, and the gate voltage was adjusted such that the heat value generated by the IGBT element was 80 W, and the thermal resistance and the temperature elevation of the semiconductor element were measured.

FIG. 6 is a cross-sectional view schematically showing an example in which a semiconductor device with a heat dissipating plate (for example, a semiconductor device whose main part has the structure shown in FIG. 1A or FIG. 7A) is disposed on a cooling block. In FIG. 6, a cooling block 90 having cooling water passages 91 is disposed such that the cooling block 90 contacts the side of the heat dissipating plate 11 opposite to the side having the semiconductor element with grease (not shown) interposed between the cooling block 90 and the heat dissipating plate 11. The heat transmitted from the semiconductor element 20 to the heat dissipating plate 11 is dissipated in the cooling block 90. The measurement was conducted at a temperature of 25° C. while allowing cooling water having a temperature of 65° C. to flow in the cooling water passage such that the temperature of the cooling block 90 was maintained nearly constant.

As a result of the measurement, the total thermal resistance of the semiconductor element heat dissipating member mainly comprised of the heat dissipating plate and the electrically insulating amorphous carbon film was found to be about 0.16 K/W, and the temperature elevation of the IGBT element was about 13° C. Since the quantity of the heat dissipated by the IGBT element into the air is considered very small, compared with the quantity of the heat transmitted from the IGBT element to the cooling block via the semiconductor element heat dissipating member, the above result can be assumed to be caused by the heat dissipation via the semiconductor element heat dissipating member.

Comparative Example 1

In Comparative Example 1, a semiconductor device with a structure similar to that of the semiconductor device shown in FIG. 7A was produced and evaluated.

<Production of a Semiconductor Device>

On both sides of an aluminum nitride plate (insulating plate) having a length of about 9 mm, a width of about 13 mm, and a thickness of about 0.6 mm which has been cleaned, aluminum films having a thickness of 0.4 mm was formed by a bonding method, and Ni films having a thickness of 5 μm was further formed thereon by a plating method.

Then, the same heat dissipating plate as that used in Example 1 was soldered onto one side of the electrically insulating plate, and an IGBT element was soldered onto the other side, thereby forming a semiconductor device of Comparative Example 1 (hereinafter, referred to as a “semiconductor device B”).

<Evaluation>

The semiconductor device B was fixed on the cooling block as shown in FIG. 6, and the thermal resistance and the temperature elevation of the semiconductor element were measured in the same manner as in Example 1. As a result, the total thermal resistance was found to be about 0.24 K/W, and the temperature elevation of the IGBT element was found to be about 20° C.

As is clear from the comparison of the results of Example 1 and the results of Comparative Example 1, the semiconductor device A could realize a thermal resistance which was lower than that of the semiconductor device B by 30% or higher, and could realize a temperature elevation of the IGBT which was smaller than that of the semiconductor device B by 7° C.

Example 2

<Production of Semiconductor Device>

A metal plate containing 35 at. % of Cu and 65 at. % of Mo was processed to form a plate with a length of about 8 cm, a width of about 24 cm and, a thickness of 3 mm, thereby obtaining a heat dissipating plate (conductive substrate) for a semiconductor element heat dissipating member. Next, the heat dissipating plate was cleaned, and then a Cr film, an electrically insulating amorphous carbon film, an aluminum film and a Ni film were successively laminated on one side of the heat dissipating plate in the same way as in Example 1. Thereafter, six IGBT elements (with a length of about 9 mm and a width of about 12 mm) and six diodes (with a length of about 6 mm and a width of about 11 mm) were soldered thereon.

A plastic (resin block) was molded such that the plastic was disposed along the circumference of the heat dissipating plate, bus bars were provided, and electrodes disposed in contact with the IGBT elements and the diodes were connected to the bus bars by wire bonding. Then, resin was poured onto the heat dissipating plate surrounded by the plastic to perform sealing, whereby a semiconductor device of Example 2 (hereinafter, referred to as a "semiconductor device C") was obtained. The cross-section passing the IGBT elements of the semiconductor device C had a similar structure to FIG. 2, and semiconductor device C had the circuit structure shown in FIG. 3.

<Evaluation>

The lower surface of the heat dissipating plate of the semiconductor device C was coated with grease, and fixed to a water-cooling block made of aluminum, as shown in FIG. 6. A cooling-heating cycle experiment (temperature cycles between −40° C. to +105° C. in the atmospheric air) was performed while allowing cooling water having a temperature of 65° C. to flow through the cooling water passages such that the temperature of the water-cooling block was maintained constant. As a result, peeling of the IGBT elements off the heat dissipating plate did not occur even after over 3000 cooling-heating cycles.

This result indicates that the semiconductor device comprising the semiconductor element heat dissipating member of the present invention can maintain stable heat dissipation property and electrical insulation property without occurrence of peeling of the semiconductor element off the semiconductor element heat dissipating member even when exposed to a harsh condition.

Example 3

<Production of Semiconductor Device>

A semiconductor device of Example 3 (hereinafter, referred to as a "semiconductor device D") was produced in the same manner as in Example 1, except that the electrically insulating amorphous carbon film was formed by using an RF plasma CVD apparatus.

The formation of the electrically insulating amorphous carbon film by using the RF plasma CVD apparatus was conducted as follows. First, the heat dissipating plate with the Cr film formed thereon was placed in the vacuum chamber of the RF plasma CVD apparatus, and the vacuum chamber was deaerated to $3\times10^{-3}$ Pa or lower. Next, methane as a raw material gas was introduced so as to make the pressure of the vacuum chamber 13.3 Pa. Then, RF voltage of 13.56 MHz was applied to the sample stage to form the electrically insulating amorphous carbon film containing hydrogen with a thickness of 1 μm. The content of hydrogen in the electrically insulating amorphous carbon film was measured by an ERD method, and found to be about 27 at. %.

The crystallinity of the electrically insulating amorphous carbon film was evaluated by an X-ray diffraction using a Cu tube at an acceleration voltage of 40 kV, an electric current of 300 mA, and a diffraction angle detection zone of 10° to 80°. As a result, sharp diffraction lines were not observed except for the diffraction lines derived from Cu and Mo, which were components of the conductive substrate, and from Cr in the Cr film. Accordingly, it was confirmed that the electrically insulating amorphous carbon film was amorphous.

<Evaluation>

In the same manner as in Example 1, the thermal resistance and the elevated temperature of the semiconductor element were measured using the semiconductor device D. As a result, the total thermal resistance of the semiconductor element heat dissipating member was about 0.16 K/W, and the temperature elevation of IGBT element was about 13° C.

Example 4

In the above Examples and Comparative Example, the heat dissipation property and the peeling property were evaluated. In the following, an example is described in which the breakdown resistance characteristics when an electrically insulating organic film was provided were evaluated. In order to make easier the confirmation of the effects of the electrically insulating organic film on the breakdown voltage characteristics, SUS material was used as the conductive substrate and the semiconductor element heat dissipating member of Example 4 was produced in a circumstance in which dust easily adheres to the surface of the conductive substrate.

<Production of Semiconductor Element Heat Dissipating Member>

Formation of Electrically Insulating Amorphous Carbon Film

First, a disc-shaped conductive substrate made of SUS having a diameter of 30 mm and a thickness of 3 mm was prepared as the conductive substrate. Next, without being cleaned, the conductive substrate was placed on a sample stage in the vacuum chamber of a plasma CVD apparatus. The vacuum chamber was deaerated to $1.3\times10^{-2}$ Pa or lower. Then, 50 sccm of methane and 4 sccm of tetramethylsilane were introduced as raw material gases, and 30 sccm of Ar and 30 sccm of hydrogen were introduced as dilution gases. The total pressure was maintained at 533 Pa, and a DC voltage was applied between the sample stage and the counter electrode to form an electrically insulating amorphous carbon film containing hydrogen and silicon on the surface of the conductive substrate (the surface contacting to the sample stage, which is hereinafter referred to as "back side", and the surface on the opposite side), and on the side surfaces. The thickness of the electrically insulating amorphous carbon film formed on the surface of the conductive substrate was about 3 μm. When the surface of the conductive substrate was observed by an optical microscope, pinhole defects were observed approximately at a rate of one per several hundred $\mu m^2$, and the maximum size of the pinhole defects was about 10 μm in terms of the diameter.

Formation of Electrically Insulating Organic Film

Next, a lead wire was soldered to the back side of the conductive substrate, and the side surfaces, the backside and the lead wire were covered by an epoxy resin.

Then, the conductive substrate which had been subjected to the above processes and a copper plate as a counter electrode were placed in a glass cell (electrodeposition cell) such that the counter electrode faced the electrically insulating amorphous carbon film formed on the conductive substrate and such that the distance between the counter electrode and the surface of the conductive substrate was 2 cm. The copper plate and the lead wire were connected to a power supply. Further, an electrodeposition liquid containing a thermoplastic cation type electrodeposition composition comprised on the following components was poured such that the conductive substrate and the counter electrode were completely submerged in the liquid.

| | |
|---|---|
| Aqueous dispersion: | 4.9 wt % |
| cyclohexanone: | 14.0 wt % |
| γ-butyrolactone: | 3.5 wt % |
| N-methylpyrrolidone: | 17.5 wt % |
| Water: | 60.1 wt % |

In the electrodeposition liquid, the aqueous dispersion was comprised of polyimide particles obtained by mixing and dissolving the soluble polyimide and amine modified acryl polymer; specifically, EDP001 manufactured by JSR Inc. was used.

Then, a voltage was applied to the counter electrode for 10 seconds such that the electric potential of the conductive substrate was −10 V, thereby forming an electrodeposition film on the electrically insulating amorphous carbon film. Specifically, hydroxide ions were generated by catholysis of water in the neighborhood of the surface of the electrically insulating amorphous carbon film (including the region having pinholes); and the increase in pH caused neutralization of protons, so that the aqueous dispersion became neutral colloidal particles; and the colloidal particles deposited (electrodeposited) on the periphery of the pinholes or on the electrically insulating amorphous carbon film to form the electrodeposition film.

After forming the electrodeposition film, the conductive substrate was taken out of the electrodeposition cell and immersed in a cleaning liquid comprised of the following composition, so that non-electrodeposited unreacted cations were removed.

| | |
|---|---|
| cyclohexanone: | 13 wt % |
| γ-butyrolactone: | 3 wt % |
| N-methylpyrrolidone: | 17 wt % |
| water: | 67 wt % |

Next, the conductive substrate with the electrodeposition film formed on the electrically insulating amorphous carbon film was left for 10 minutes on a hot plate which was heated to 100° C., thereby eliminating solvents contained in the electrodeposition film to dry the electrodeposition film. Thereafter, the conductive substrate was left in an oven at 250° C. for 30 minutes to allow the electrodeposition film to undergo cross-linking polymerization, thereby forming an electrically insulating organic film. In this way, the semiconductor element heat dissipating member of Example 4 was obtained.

The thickness of the electrically insulating organic film formed on the electrically insulating amorphous carbon film was about 2 μm (5 μm in the pinhole region), and the pinhole region was completely filled in with the electrically insulating organic film.

<Evaluation>

A mask with an opening having a diameter of 5 mm was placed on the surface of the conductive substrate and a platinum electrode having a thickness of 0.1 μm was formed in the opening using an ion coater (LC50 manufactured by Shimadzu Corporation Inc.). Then, the surface of the platinum electrode was brought into contact with the probe of a curve tracer (type 370A, manufactured by Sony-Techtronics Inc.), and a voltage was applied, thereby measuring the breakdown voltage.

As a result, even when the applied voltage was elevated to 400 V, the leak current was extremely small and was substantially at a level (0.01 μA or lower) incapable of measurement, and the breakdown did not occur. That is, the breakdown voltage of the semiconductor element heat dissipating member of Example 4 was at least 400 V or higher.

For reference, this measuring method can reliably detect the leak current caused by tiny pinholes and is a more strict measuring method than a method of bringing the probe into contact with the surface of the conductive substrate; this is because platinum is also provided inside the pinholes in this measuring method.

Comparative Example 2

A semiconductor element heat dissipating member of Comparative Example 2 was produced in the same manner as in Example 4, except that the electrically insulating organic film was not formed, and then its breakdown voltage was measured in the same manner as in Example 4.

As a result, leak current occurred even at application of a low voltage, and the leak current increased as the applied voltage is elevated. The leak current was found to be about 36 μA when the applied voltage was about 40 V, and breakdown occurred when the applied voltage reached about 84 V.

The results of Example 4 and Comparative Example 2 indicate that a sufficient breakdown voltage can be secured by forming the electrically insulating organic film on the electrically insulating amorphous carbon film even when many pinhole defects occur on the electrically insulating amorphous carbon film.

As described above, according to the invention, a semiconductor element heat dissipating member with excellent heat dissipation characteristics and adhesion characteristics can be provided which enables production of a semiconductor device at a low cost, and a semiconductor device using the semiconductor element heat dissipating member and a production method thereof are also provided.

Example 5

In an embodiment of the method of the invention for producing the semiconductor element heat dissipating member using a plasma CVD method, a plurality of conductive substrates connected to the negative pole are arranged in a deposition furnace such that the conductive substrates face each other, and glow discharge is conducted while adjusting the sheath width such that negative glows of two adjacent conductive substrates overlap each other. In Example 5, an example is explained in which a semiconductor device was produced through a process of forming an electrically insulating amorphous carbon film in the above-described manner, and evaluated.

First, the method of forming an electrically insulating amorphous carbon film will be described with reference to FIGS. 8 and 9. FIG. 9 is a cross sectional view taken along the line X-X' shown in FIG. 8 and schematically shows the glow discharge during the film-formation of this Example.

(Film-Forming Apparatus)

Figure 8:
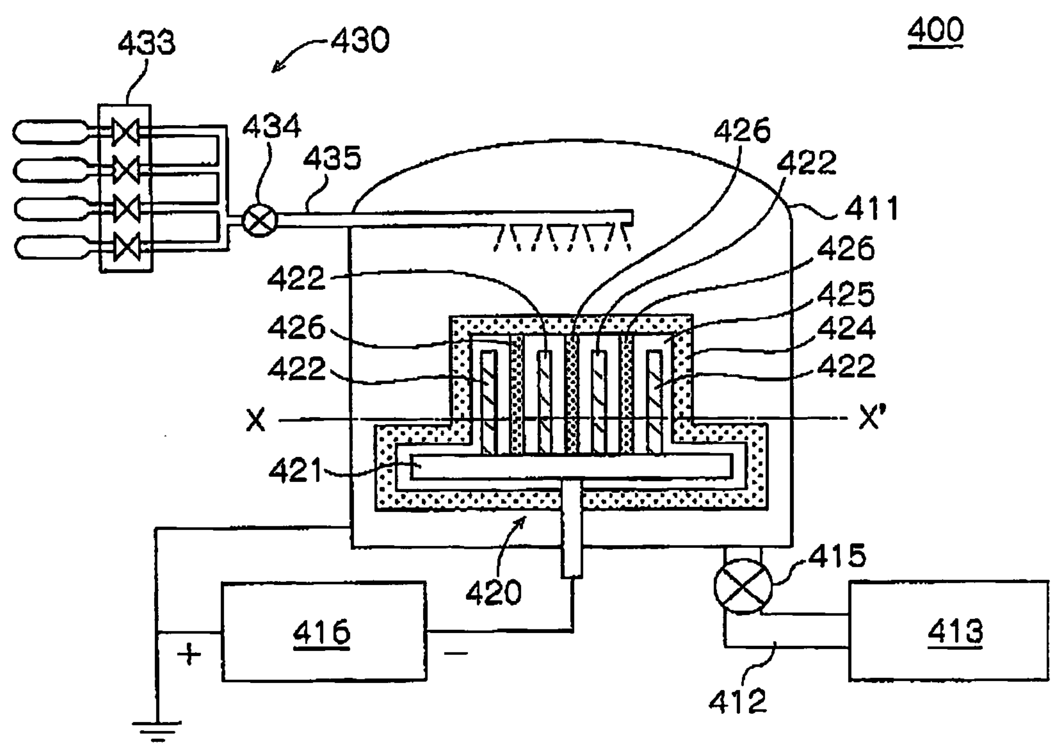
FIG. 8 is a view explaining an example of a film-forming device for an electrically insulating amorphous carbon film according to the invention.
Figure 9:
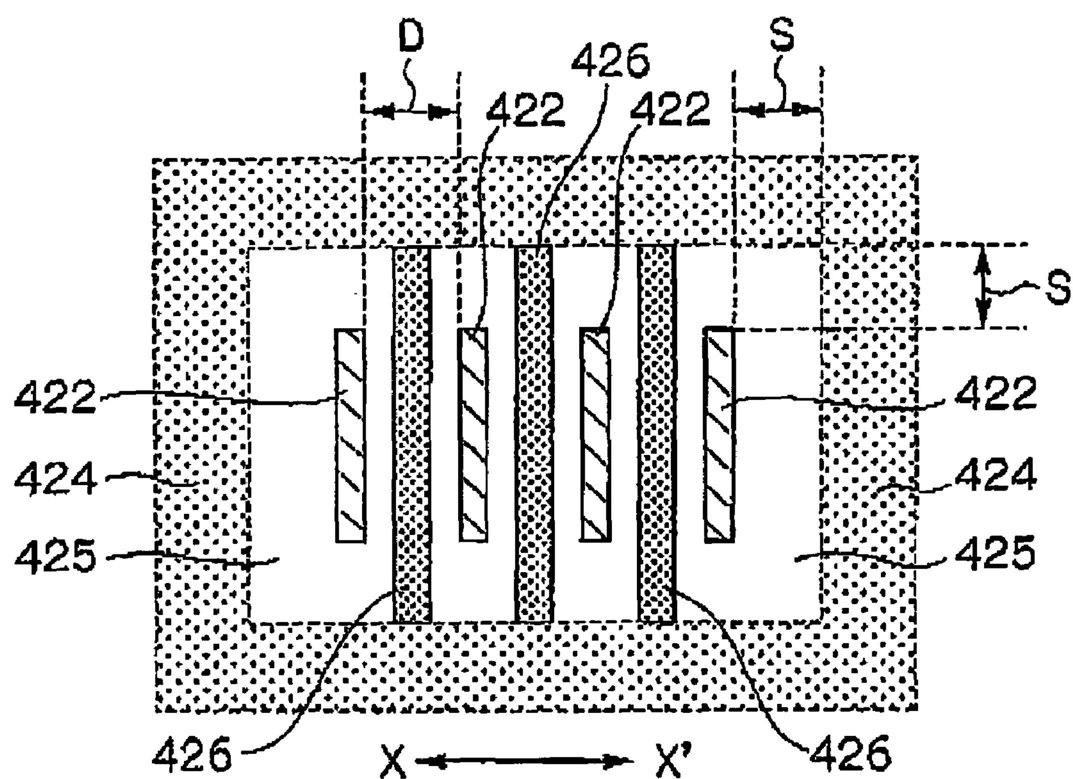
FIG. 9 is a cross-sectional view of FIG. 8 along the line X-X', FIG. 9 schematically showing the glow discharge during the film-forming process.

FIG. 8 is a view schematically illustrating the structure of a film-forming apparatus for forming an electrically insulating amorphous carbon film.

The film-forming apparatus 400 for forming the electrically insulating amorphous carbon film of this Example has a cylindrical chamber 411 made of stainless steel serving as a deposition furnace and an exhausting system 413 connected to the chamber 411 by an exhaustion passage 412. The exhausting system 413 comprises an oil rotary pump, a mechanical booster pump, and an oil diffusion pump, and adjusts the processing pressure in the chamber 411 by opening or closing an exhaustion control valve 415 disposed on the exhaustion passage 412.

A cathode 420 electrically connected to the negative pole of a plasma power supply 416, and a gas supplying means 430 are provided in the chamber 411.

The cathode 420 comprises a supporting plate 421 connected to the negative pole of the plasma power supply 416 and conductive substrates 422 on which an electrically insulating amorphous carbon film is to be formed. The supporting plate 421 is made of stainless steel and is in a disc shape, and coaxially fixed to the bottom of the cylindrical chamber 411. The conductive substrates 422 are supported on the supporting plate 421 in an arbitrary arrangement.

The film-forming apparatus has a gas supplying means 430. The gas supplying means 430 supplies a mixture gas of a raw material gas and a dilution gas to the chamber 411 at a predetermined flow ratio. The mixture gas is supplied to the interior of the chamber 411 by a gas supplying tube 435 through a gas supplying valve 434 after its flowing rate is controlled by a mass flow controller (MFC) 433. The gas supplying tube 435 has a plurality of holes formed thereon at a constant interval along the direction of the length of the gas supplying tube 435. The gas supplying tube 435 is disposed in the center of the chamber 411, and uniformly supplies the mixture gas to the conductive substrates 422 supported by the supporting plate 421.

The positive pole of the plasma power supply 416 is connected to the chamber 411 and the earth, so that the side wall of the chamber 411 is an earth electrode (anode).

(Method of Forming Electrically Insulating Amorphous Carbon Film)

An electrically insulating amorphous carbon film was formed on the surface of the conductive substrates 422, using the film-forming apparatus for forming the electrically insulating amorphous carbon film with the above-described structure. In this Example, four conductive substrates (about 39 mm in length, about 22 mm in width, and 3 mm in thickness) made of aluminum alloy 1050 were used as the conductive substrates 422. As shown in FIGS. 8 and 9, these conductive substrates 422 were arranged in parallel along the thickness direction, and fixed to the supporting plate 421 by being inserted in 1 mm-deep grooves provided on the supporting plate 421. The distance D between the surfaces of any two adjacent conductive substrates 422 which surfaces faced each other was 10 mm.

Next, the film-forming procedure will be described below. First, the interior of the chamber 411 was deaerated to a degree of vacuum of $1\times10^{-2}$ Pa by the exhaustion system 13. Then, hydrogen gas as a dilution gas was introduced by opening the gas supplying valve 434. The flow rate of the gas was controlled by the MFC 433. Then, the processing gas pressure in the chamber 411 was adjusted to 260 Pa by adjusting the valve travel of the exhaustion adjusting valve 415. A voltage of −100 V was applied to the cathode 420 using the plasma power supply 416. When the voltage was applied, glow discharge occurred around the cathode 420 to heat the cathode. The power of the plasma power supply was increased to set the temperature of the substrate at 300° C. Then, methane ($CH_4$) and tetramethlsilane (TMS, $Si(CH_3)_4$) as raw material gases were introduced to form an electrically insulating amorphous carbon film on the surface of the conductive substrate 422. The temperature in film-formation was set at 300° C. In the measurement of the temperature of the substrate, a dissipation thermometer was used. The flow rate of the mixture gas was as follows: 50 sccm of methane, 1 sccm of TMS and 60 sccm of hydrogen gas.

Figure 10:
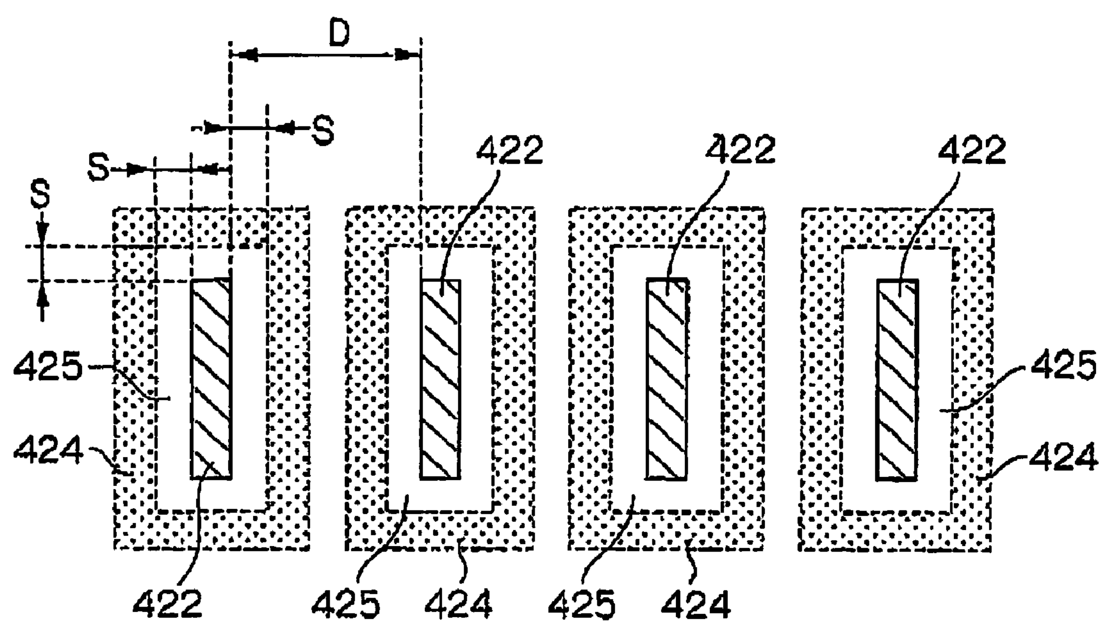
FIG. 10 is a view schematically showing the glow discharge during film-forming process, FIG. 10 being given for comparison with Examples.

FIG. 9 shows the glow discharge occurring during the film-formation. D represents the distance between the surfaces of the conductive substrates which surfaces face each other. Sheaths 425 with a sheath width S were formed around the conductive substrates 422 along the conductive substrates 422. The sheaths 425 were close to each other between the surfaces facing each other, and negative glows 424 overlapped each other in the region represented by reference number 426. The glow discharge in the region 426 was lighter than the glow discharge in other regions where negative glows 424 did not overlap each other. When the negative glows overlapped each other, the discharge was stable and the glow discharge had a low voltage and a high electric current density. After discharge for 2.5 hours, an electrically insulating amorphous carbon film having a thickness of 22 μm was formed on the surface of the conductive substrate 422. FIG. 10 shows glow discharge in the case where negative glows 424 do not overlap each other.

The hydrogen content in the film was measured by an ERD (Elastic Recoil Detection method), and was found to be 40%. The hardness of the film was measured by a nanoindenter, and found to be Hv600 in terms of a Vickers hardness. The Young's modulus of the film was found to be 50 GPa. The defect area ratio of the film was found to be $10^{-6}$ by a measurement by a critical passivation current density method (CPCD method), which is an electrochemical method.

Figure 11:
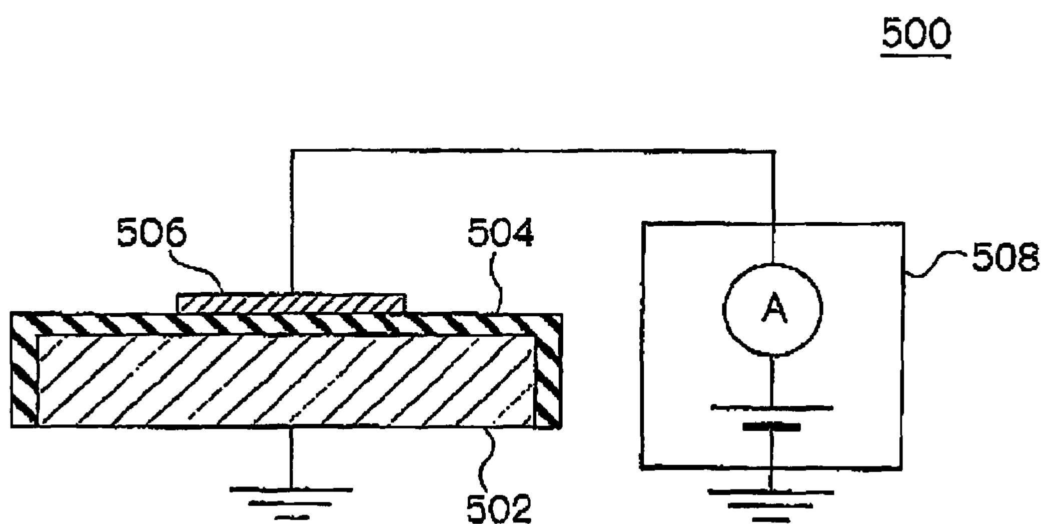
FIG. 11 is a diagrammatic illustration of a measuring device for measuring the electrically insulating property.
Figure 12:
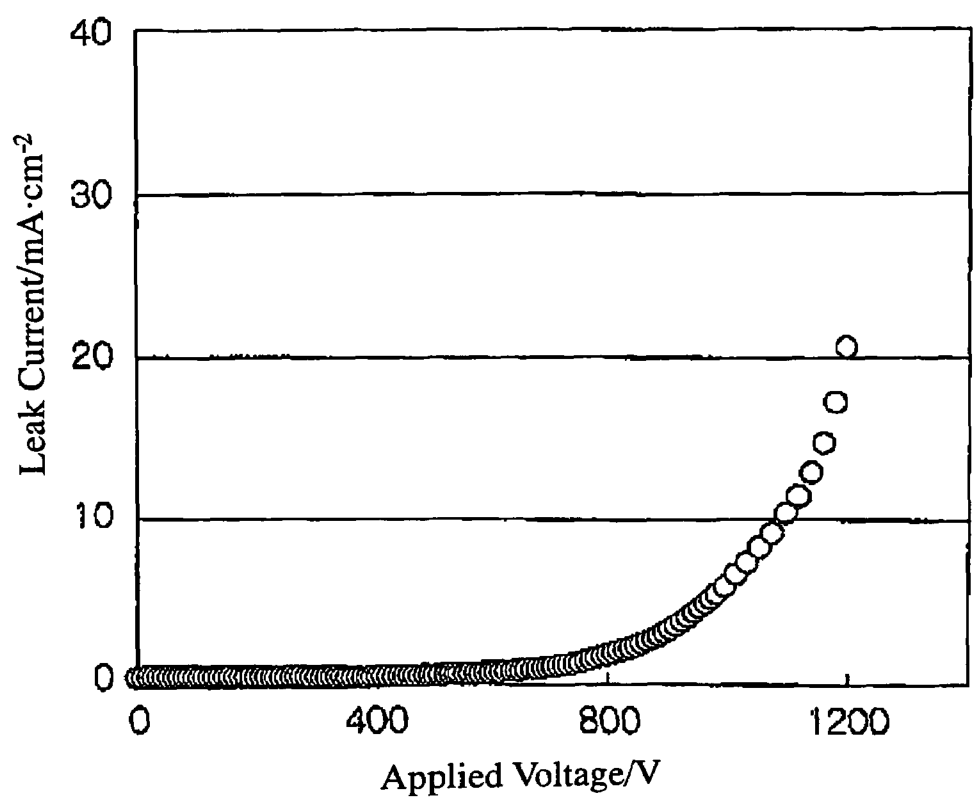
FIG. 12 is a graph showing the electrically insulating property, and the change of leak current in relation to the supplied voltage.

In addition, the insulation characteristics of the electrically insulating amorphous carbon film were examined. The insulation characteristics were evaluated by the breakdown voltage. The breakdown voltage was measured by applying a DC voltage to the electrically insulating amorphous carbon film in the thickness direction while detecting the leak current. FIG. 11 is a schematic diagram of the structure of the measuring apparatus. First, one side of the conductive substrate 502 is polished to remove the electrically insulating amorphous carbon film. Then, the surface of the conductive substrate 502 deprived of the electrically insulating amorphous carbon film is connected to the earth, and an electrode 506 of ϕ 6 mm is formed on the electrically insulating amorphous carbon film 504 on the other side of the conductive substrate 502, using a conductive paste. A DC voltage is applied to thickness direction via the electrode 506, and the leak current is detected by a curve tracer 508. As a result, as shown in FIG. 12, breakdown did not occur in the electrically insulating amorphous carbon film of this Example even upon application of 1200V. At this time, the volume resistivity of the film was $10^8$ to $10^{11}$ Ω·cm.

In the following, production of a semiconductor device will be explained in which the electrically insulating amorphous carbon film prepared as described above was used as a semiconductor element heat dissipating member.

<Production of Semiconductor Device>

A sintered metal material containing 35 at. % of Cu and 65 at. % of Mo was processed into plate with a length of 9 mm, a width of 13 mm and a thickness of 3 mm to form a heat dissipating plate (conductive substrate) for a semiconductor element heat dissipating member. Then, an amorphous carbon film with a thickness of 12 μm was formed on the conductive substrate by the above-mentioned method with a processing time of 2 hours. Then, Cr with a thickness of about 0.2 μm and Cu with a thickness of about 0.5 μm were deposited on the electrically insulating amorphous carbon film to form an electrode, and then the electrode was electroplated with Cu with a thickness of 36 μm and Ni with a thickness of 3 μm. Then, an IGBT element was soldered to the electrode.

A plastic (resin block) was disposed such that the plastic surrounded the heat dissipating plate, and bus bars were arranged, and the bus bars were connected to an electrode disposed in contact with the IGBT element and diode by wire bonding. Then, a resin was poured onto the heat dissipating plate surrounded by the plastic to perform sealing, thereby obtaining a semiconductor device of Example 5 (hereinafter, referred to as a "semiconductor device E") whose cross-section passing through the IGBT element has a structure similar to FIG. 2. The structure of the main part of the semiconductor device E is shown in FIG. 13A.

<Evaluation>

The lower surface of the semiconductor device E was coated with grease, and was fixed to an aluminum water-cooling block as shown in FIG. 6. A cooling-heating cycle experiment (temperature cycles between −40° C. to +105° C. in the atmospheric air) was performed while allowing cooling water of 65° C. to flow through the cooling water passage so as to maintain the temperature of the water-cooling block constant. As a result, the IGBT element did not peel off the heat dissipating plate even after 3000 or more cooling-heating cycles.

This result indicates that the semiconductor device using the semiconductor element heat dissipating member of the invention can maintain stable dissipation characteristics and insulation characteristics even under a harsh condition, without peeling of the semiconductor element off the semiconductor element heat dissipating member.

Further, the thermal resistance was measured in the same manner as in Example 1. As a result, the total thermal resistance was found to be 0.19 K/W.

Comparative Example 3

In Comparative Example 3, an example is described in which a semiconductor device with a structure similar to that of the semiconductor device shown in FIG. 13B was produced and evaluated.

<Production of Semiconductor Device>

An aluminum nitride plate (insulating plate) having a length of about 9 mm, a width of about 13 mm, and a thickness of about 0.6 mm was prepared and cleaned, and then both sides thereof were metalized with an aluminum film having a thickness of 0.4 mm.

Then, the same heat dissipating plate as that used in Example 5 was soldered to one surface of the electrically insulating plate, and an IGBT element was soldered to the other surface of the electrically insulating plate to obtain a semiconductor device of Comparative Example 3 (hereinafter, referred to as a "semiconductor device F").

<Evaluation>

The semiconductor device F was fixed on the cooling block as shown in FIG. 6, and its thermal resistance was measured in the same manner as in Example 5. As a result, the total thermal resistance was found to be 0.35 K/W.

As is clear from comparison of the result of Example 5 with Comparative Example 3, it is possible to secure breakdown voltage of over hundreds of volts and to reduce the thermal resistance by 40% or more by forming a thick electrically insulating amorphous carbon film directly on Cu—Mo and integrating them, instead of using the conventional lamination structure of a 0.6 mm-thick aluminum nitride plate and a Cu—Mo cooling plate.

In Example 5, the plurality of conductive substrates connected to the negative pole were arranged in the deposition furnace such that the conductive substrates faced each other, and glow discharge was conducted while adjusting the sheath width such that the negative glows of two adjacent conductive substrates overlapped each other, thereby forming the electrically insulating amorphous carbon film and finally forming the semiconductor device. As the result, the obtained electrically insulating amorphous carbon film included a large amount of hydrogen and had a low Young's modulus. In addition, addition of Si improves the adhesion to the conductive substrate and reduces the difference in thermal expansion coefficient from the Si semiconductor element, thereby enabling production of a semiconductor device with an excellent thermal fatigue life. Therefore, the temperature of the element can be maintained low compared with a conventional device, provided that the electric power applied to the element is the same, thereby improving the reliability. Further, since the cooling capability is improved, more electric current can be applied to the element, whereby the number of elements can be decreased. Furthermore, since an expensive ceramic plate such as aluminum nitride is unnecessary, the cost of inverters can be decreased.

INDUSTRIAL APPLICABILITY

The semiconductor element heat dissipating member according to the present invention is used for a semiconductor device, and the semiconductor device may be used for an electric circuit and the like.

The invention claimed is:

1. A semiconductor element heat dissipating member comprising:

a conductive substrate; and an electrically insulating amorphous carbon film including hydrogen, wherein the electrically insulating amorphous carbon film is provided at least on a region of the conductive substrate on which region a semiconductor element is to be provided, wherein a content of hydrogen in the electrically insulating amorphous carbon film is in the range of 20 to 60 at. %, and wherein a Vickers hardness of the electrically insulating amorphous carbon film is Hv 400 to 1500.

2. The semiconductor element heat dissipating member according to claim 1, wherein the electrically insulating amorphous carbon film further includes silicon.

3. The semiconductor element heat dissipating member according to claim 2, wherein a content of silicon in the electrically insulating amorphous carbon film is in the range of 1 to 50 at. %.

4. The semiconductor element heat dissipating member according to claim 1, wherein an electrically insulating organic film is provided on the side of the electrically insulating amorphous carbon film on which side the semiconductor element is to be provided.

5. The semiconductor element heat dissipating member according to claim 1, wherein the conductive substrate is a metal substrate containing at least one of Al, Cu, Mo, W, Si and Fe.

6. The semiconductor element heat dissipating member according to claim 1, wherein the semiconductor element is a large-scale integrated circuit, or a power device selected from a bipolar-type transistor, an MOS-type transistor, or a diode.

7. The semiconductor element heat dissipating member according to claim 1, wherein an elastic modulus of the electrically insulating amorphous carbon film is 40 to 150 CPa.

8. The semiconductor element heat dissipating member according to claim 1, wherein a thickness of the electrically insulating amorphous carbon film is 0.1 to 200 μm.

9. A method of producing a semiconductor element heat dissipating member of claim 1, the method comprising:

forming an electrically insulating amorphous carbon film including hydrogen on a conductive substrate, wherein the electrically insulating amorphous carbon film is formed by a plasma CVD method.

10. The method of producing a semiconductor element heat dissipating member according to claim 9, the method comprising conducting a glow discharge, wherein in the glow discharge, a plurality of conductive substrates connected to a cathode are arranged in a deposition furnace such that the plurality of conductive substrates face each other, and a sheath width is adjusted such that negative glows of two adjacent conductive substrates overlap each other.

11. The method of producing semiconductor element heat dissipating member according to claim 10, wherein the plurality of the conductive substrates are held by a substrate holding element connected to the cathode.

12. The method of producing a semiconductor element heat dissipating member according to claim 10, wherein in the glow discharge, the sheath width is adjusted by adjusting a pressure of a processing gas and a plasma electric power such that negative glows of two adjacent conductive substrates overlap each other.

13. The method of producing a semiconductor element heat dissipating member according to claim 10, wherein the sheath width satisfies the following expression:

$$D/4 \leqq S \leqq D$$

wherein S represents the sheath width, and D represents a distance between surfaces of the conductive substrates which surfaces face each other.

14. The method of producing a semiconductor element heat dissipating member according to claim 12, wherein:

a pressure of the processing gas is 13 to 1330 Pa, and the distance between surfaces of two adjacent conductive substrates which surfaces face each other is 2 to 60 mm.

15. The method of producing a semiconductor element heat dissipating member according to claim 9, wherein the processing gas used in the plasma CVD method consists of a raw material gas including a hydrocarbon gas, or consists of a raw material gas including a hydrocarbon gas and a dilution gas including at least one of hydrogen gas and a noble gas.

16. The method of producing a semiconductor element heat dissipating member according to claim 15, wherein the raw material gas further includes at least one of a halogen compound and an organic-metal including gas including silicon.

17. A method of producing a semiconductor element heat dissipating member of claim 4 comprising:

forming the electrically insulating amorphous carbon film, and then forming the electrically insulating organic film on a surface of the electrically insulating amorphous carbon film, wherein the electrically insulating organic film is formed by an electrophoresis.

18. A semiconductor device comprising a semiconductor element heat dissipating member of claim 1 and at least one semiconductor element provided on the semiconductor element heat dissipating member.

19. The semiconductor element heat dissipating member according to claim 1, wherein an electrically insulating organic film is provided only on the side of the electrically insulating amorphous carbon film on which side the semiconductor element is to be provided.

20. The semiconductor element heat dissipating member according to claim 1, wherein an electrically insulating organic film is provided on a part of the surface of the electrically insulating amorphous carbon film in one or more portions of the carbon film that are thinner than other portions of the carbon film.

* * * * *

UNITED STATES PATENT AND TRADEMARK OFFICE

CERTIFICATE OF CORRECTION

PATENT NO. : 7,396,735 B2
APPLICATION NO. : 10/538222
DATED : July 8, 2008
INVENTOR(S) : Kazuyuki Nakanishi et al.

It is certified that error appears in the above-identified patent and that said Letters Patent is hereby corrected as shown below:

On the title page, item (75), after "Hideo Hasegawa," change "Negoya (JP)" to --Nagoya (JP)--.

Column 31, line 28, change "CPa" to --GPa--.

Signed and Sealed this

Twenty-fourth Day of March, 2009

JOHN DOLL

*Acting Director of the United States Patent and Trademark Office*